United States Patent [19]

Zook

[11] Patent Number: 5,629,949
[45] Date of Patent: May 13, 1997

[54] ERROR CORRECTION VERIFICATION METHOD AND APPARATUS USING CRC CHECK REMAINDERS

[75] Inventor: Christopher P. Zook, Longmont, Colo.

[73] Assignee: Cirrus Logic, Inc., Fremont, Calif.

[21] Appl. No.: 468,108

[22] Filed: Jun. 6, 1995

Related U.S. Application Data

[63] Continuation of Ser. No. 326,126, Oct. 18, 1994, Ser. No. 325,717, Oct. 18, 1994, Ser. No. 326,164, Oct. 18, 1994, Pat. No. 5,446,743, Ser. No. 325,831, Oct. 18, 1994, Pat. No. 5,467,297, and Ser. No. 325,850, Oct. 18, 1994, Pat. No. 5,491,701, said Ser. No. 326,126, is a continuation-in-part of Ser. No. 147,865, Nov. 4, 1993, Pat. No. 5,465,260, Ser. No. 147,650, Nov. 4, 1993, abandoned, Ser. No. 147,758, Nov. 4, 1993, abandoned, Ser. No. 148,068, Nov. 4, 1993, abandoned, Ser. No. 310,973, Sep. 23, 1994, and Ser. No. 124,936, Sep. 21, 1993, Pat. No. 5,449,424.

[51] Int. Cl.$^6$ .................................................. G11B 20/18
[52] U.S. Cl. ................................. 371/37.1; 371/40.1
[58] Field of Search .................. 371/40.1, 37.1, 371/3

[56] References Cited

U.S. PATENT DOCUMENTS

| | | | |
|---|---|---|---|
| 4,413,339 | 11/1983 | Riggle et al. | 371/40.1 |
| 4,680,746 | 7/1987 | Suzuki et al. | 369/50 |
| 4,703,485 | 10/1987 | Patel | 371/37.1 |
| 4,777,635 | 10/1988 | Glover | 371/37.5 |
| 4,782,490 | 11/1988 | Tenengolts | 371/37.5 |
| 4,839,896 | 6/1989 | Glover et al. | 371/37.8 |
| 4,949,342 | 8/1990 | Shimbo et al. | 371/40.1 |
| 5,136,592 | 8/1992 | Weng | 371/39.1 |
| 5,157,669 | 10/1992 | Yu et al. | 371/37.7 |
| 5,172,380 | 12/1992 | Odaka | 371/37.4 |
| 5,182,752 | 1/1993 | DeRoo et al. | 371/37.7 |
| 5,241,546 | 8/1993 | Peterson et al. | 371/37.1 |
| 5,267,241 | 11/1993 | Kowal | 371/5.3 |
| 5,384,786 | 1/1995 | Dudley et al. | 371/37.1 |
| 5,412,666 | 5/1995 | Squires et al. | 371/37.4 |
| 5,422,895 | 6/1995 | Nguyen et al. | 371/37.5 |
| 5,444,719 | 8/1995 | Cox et al. | 371/37.1 |
| 5,465,260 | 11/1995 | Zook | 371/37.7 |

OTHER PUBLICATIONS

Chang et al., "Cyclic Memory Record Format Without Intrarecord Gaps", IBM Technical Disclosure Bulletin, vol. 19, No. 10, pp. 3890-3891, Mar. 1977.

*Primary Examiner*—Stephen M. Baker
*Attorney, Agent, or Firm*—Nixon & Vanderhye, P.C.

[57] ABSTRACT

In an error correction method for rotating magnetic media, CRC check remainder bytes are generated by using input data from a read sector to obtain regenerated CRC bytes for the read sector, and adding the regenerated CRC bytes to incoming CRC bytes of the read sector. Error patterns for correcting errors in the read sector are generated. Both the CRC check remainder bytes and the error patterns are used for confirming that the error patterns accurately correct the errors in the read sector. The confirmation involves loading a predetermined number of the CRC check remainder bytes into a corresponding number of registers (1302). For each of a plurality of error patterns of the sector, the error pattern is added to the register (1302) having its CRC check remainder bytes affected by the error pattern. A determination is then made whether the contents of any of the registers (1302) indicates inaccurate correction of the errors.

16 Claims, 23 Drawing Sheets

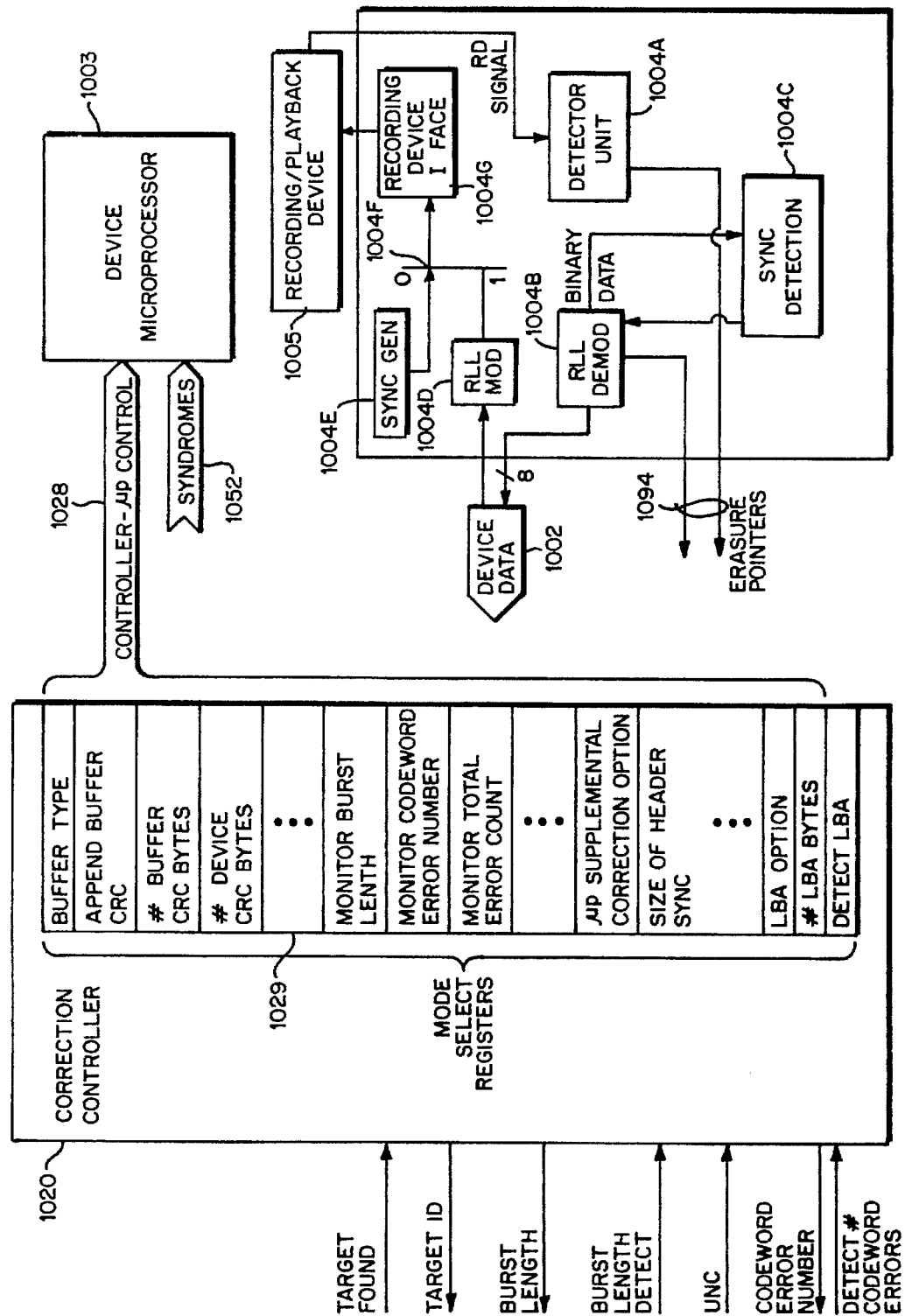

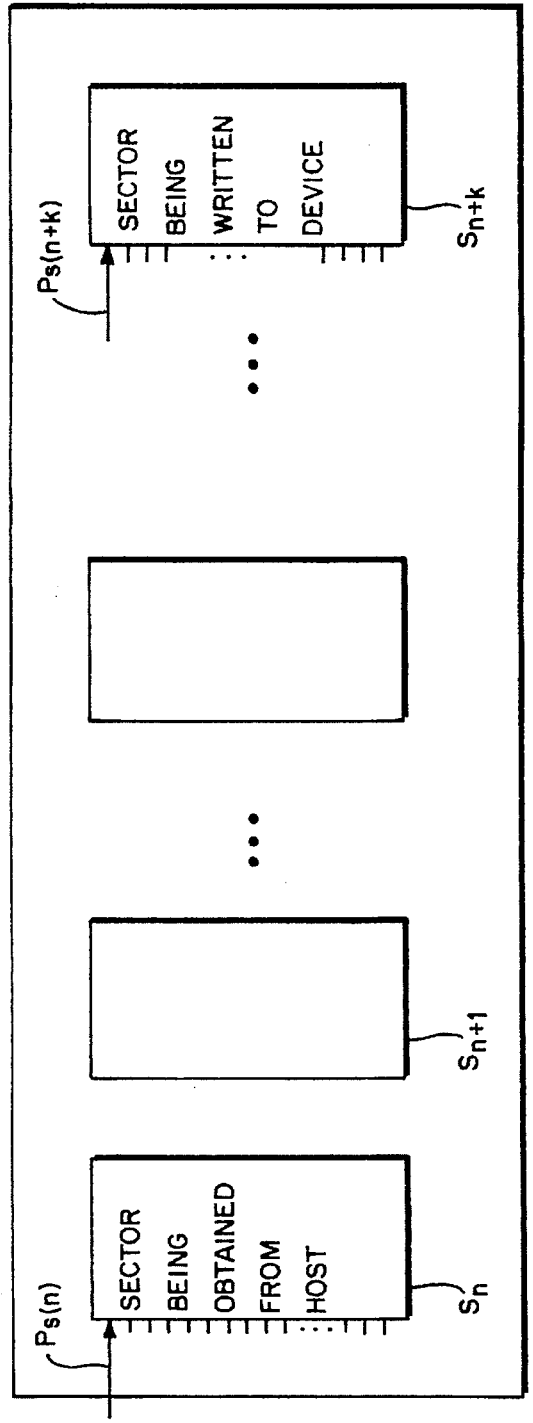
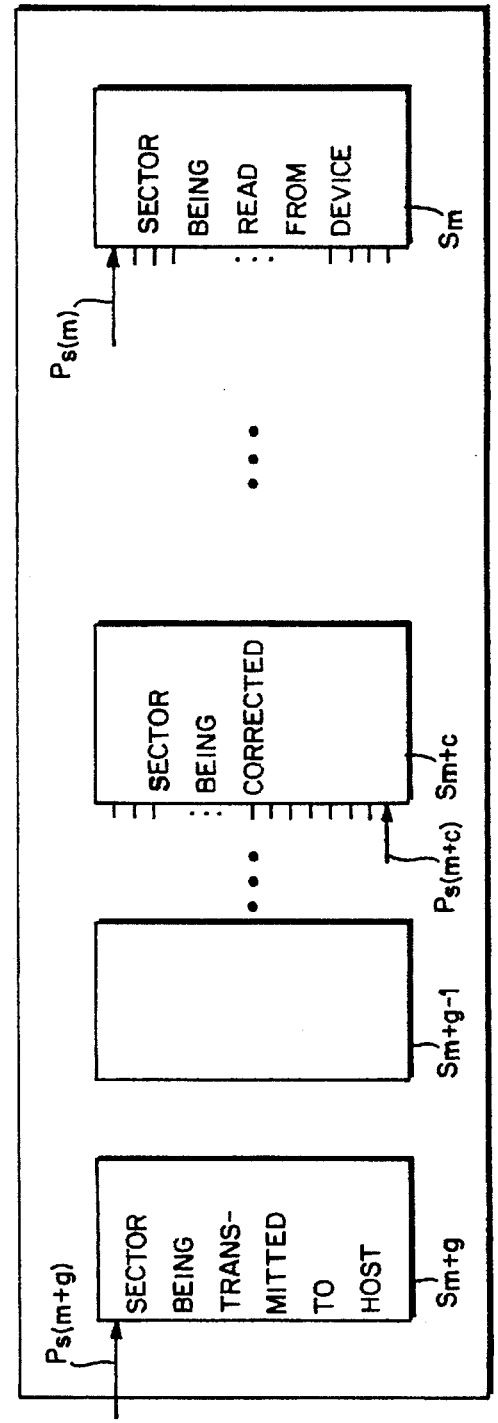

WRITE OPERATION

READ FROM DEVICE OPERATION

ERROR CORRECTION VERIFICATION METHOD AND APPARATUS USING CRC CHECK REMAINDERS

CROSS-REFERENCES TO RELATED APPLICATIONS

This patent application is a continuation of the following U.S. patent applications (all of which are incorporated herein by reference): U.S. patent application Ser. No. 08/326,126, filed Oct. 18, 1994, entitled "ERROR CORRECTION METHOD AND APPARATUS"; U.S. patent application Ser. No. 08/325,717, filed Oct. 18, 1994, entitled "CYCLIC REDUNDANCY CHECK METHOD AND APPARATUS", U.S. patent application Ser. No. 08/326,164, filed Oct. 18, 1994, entitled "REED SOLOMON DECODER", now U.S. Pat. No. 5,446,743; and U.S. patent application Ser. No. 08/325,831, filed Oct. 18, 1994, entitled "FINITE FIELD INVERSION", now U.S. Pat. No. 5,467, 297, and U.S. patent application Ser. No. 08/325,850, filed Oct. 18, 1994, entitled "BURST ERROR CORRECTOR", now U.S. Pat. No. 5,491,701. The aforementioned U.S. patent application Ser. No. 08/326,126, filed Oct. 18, 1994, entitled "ERROR CORRECTION METHOD AND APPARATUS" is, in turn, a continuation-in-part of the following patent applications (all of which are incorporated herein by reference): U.S. patent application Ser. No. 08/147,865, filed Nov. 4, 1993, entitled "DUAL PURPOSE CYCLIC REDUNDANCY CHECK", now U.S. Pat. No. 5,465,260, U.S. patent application Ser. No. 08/147,650, filed Nov. 4, 1993, entitled "REED SOLOMON DETECTOR", abandoned; and U.S. patent application Ser. No. 08/147,758, filed Nov. 4, 1993, entitled "FINITE FIELD INVERSION"abandoned; U.S. patent application Ser. No. 08/148,068, filed Nov. 4, 1993, entitled "BURST ERROR CORRECTOR"abandoned; U.S. patent applications Ser. No. 08/310,973 filed Sep. 23, 1994 and entitled "A METHOD AND APPARATUS FOR DETECTING THE TRANSFER OF A WRONG SECTOR"; and U.S. patent application Ser. No. 08/124,936 of Zook and Glover, filed Sep. 21, 1993 and entitled "PROGRAMMABLE REDUNDANCY/SYNDROME GENERATOR", now U.S. Pat. No. 5,449,424.

BACKGROUND

1. Field of Invention

This invention pertains to method and apparatus for correcting errors occurring in digital data.

2. Related Art and Other Considerations

In a digital data communication system (including storage and retrieval from optical or rotating magnetic media), error control systems are typically employed to increase the transfer rate of information and at the same time make the error rate arbitrarily low. For fixed signal-to-noise ratios and fixed bandwidths improvements can be made through the use of error-correcting codes (ECC).

With error-correction coding, the data to be transmitted or stored is mathematically processed through appropriate circuitry and/or software to obtain additional data symbols called check symbols or redundancy symbols. For further reliable communications it is necessary to be reasonably sure of detecting all transmission errors. One way of doing this is by the use of cyclic redundancy check symbols or CRCs. In general CRCs are calculated by treating data as the coefficients of a polynomial, dividing the data by another polynomial, and keeping the remainder.

The data bytes, CRC bytes, and ECC bytes together make up a codeword. The data bytes are the first bytes in the codeword. The CRC bytes follow the data bytes. The ECC bytes follow the CRC bytes. C(x) is defined as:

$$C(x) = \sum_{n=0}^{s-1} D_n X^{n+m+5} + \sum_{n=0}^{m-1} CR_n X^{n+5} + \sum_{n=0}^{4} E_n X^n$$

where $CR_n$ are the CRC bytes, $D_n$ are the data bytes, $E_n$ are the ECC bytes, s is the number of data bytes and m is the number of CRC bytes. Prior art error correction systems employ either bit-oriented or symbol-oriented CRC. However, the disadvantage of such systems is that each one is most desirable for various expected errors. That is, a bit-oriented CRC is desired if the expected errors are random bit errors whereas a symbol-oriented CRC is desired if the expected errors are burst errors or random symbol errors.

Moreover, in some magnetic disk applications, such as the writing and reading of ID fields in the header portion of a formatted sector necessitate the use of codes which can quickly correct short bursts in a small block of data on-the-fly. As existing prior art error correction systems do not correct errors located in the header ID field, such a capability is clearly needed to ensure correctly locating formatted sectors.

Additionally, all known implementations of decoding Reed-Solomon codes (a class of multiple-error correcting codes) using the Berlekamp-Massey algorithm for generating the error locator polynomial need temporary storage for at least storing the error locator polynomial coefficient resulting in an inefficient and unnecessary system costs.

While the use of ECC and CRC lower the overall probability of transferring undetected erroneous data, neither one ensures the transfer of a correct sector from the storage media to the host. Therefore, the need arises to ensure the integrity of such a transfer.

Prior art solutions generally employ a one-codeword buffer or storage means to implement on-the-fly multi-error correction system. Correction on data read from the disk is performed as data leaves a buffer local to the ECC and is corrected while in the local buffer. The corrected data is then stored in a larger buffer storing multiple codewords. The disadvantage of these system is the need for multiple buffers.

Thus, the need arises for an error tolerant system to ensure the integrity of transfer of information while maintaining efficiency.

SUMMARY

An error correction system included in a utilization device (e.g., disk drive) operates upon a plurality of sectors stored in a multi-purpose data buffer for performing write-from-host and read-from-device operations. Overlapping and asynchronous operational steps are performed with respect to the plurality of sectors, the operational steps including sector transfer into buffer, sector correction, and sector transfer out of buffer.

The error correction system includes a plurality of subsystems which are supervised and sequenced by a correction controller. The subsystems include a multi-purpose CRC generation and checking subsystem; an LBA subsystem; an ECC/Syndrome Generator subsystem; a header (ID) subsystem; a correction subsystem; and, a correction checker subsystem.

During a write-from-host operation, sector data from the host is not only transferred into the data buffer, but is also optionally transmitted to a CRC generation/checker unit which generates a programmable number of buffer CRC bytes (also known as primary CRC bytes) for the purpose of implementing an optional check to determine whether storage/retrieval in the buffer occasions an error. Moreover, during the write-from-host operation, when a sector is to be written to media, the precise location of writing on the media is ensured by the header (ID) subsection. In this regard, the header (ID) subsection checks the sector ID data obtained from the utilization device and, if necessary, performs error correction with respect to the sector ID data on-the-fly. As the sector-to-be-written is outputted from the data buffer, the sector data is applied not only to the utilization device, but also to a second CRC generator/checker unit and to the ECC/syndrome generation subsystem. The second CRC generator/checker unit regenerates a programmable number of device CRC bytes or secondary CRC bytes over the sector data. The device CRC bytes are transmitted to the utilization device for recording on the media, but additionally serve as a comparison with the buffer CRC bytes to detect whether storage/retrieval in the buffer caused an error. The device CRC bytes optionally have LBA bytes XORed therewith to provide a capability of detecting wrong sector transfer. The ECC/syndrome generation subsystem uses the sector data and the device CRC bytes in an interleaving encoding scheme to generate ECC bytes for recording on the media.

During a read-from-device operation, the header (ID) subsystem facilitates fault-tolerant location of a desired sector ID for the sector-to-be-read. The sector-to-be-read is transferred to the data buffer, and optionally applied to the second CRC generation/checker unit for generating buffer CRC bytes, similar to the write-from-host operation. The sector is also applied to the correction subsystem which checks each codeword of the sector to detect (and, if necessary and able, correct) errors on-the-fly. If the sector is correctable by the correction subsystem, correction checker subsystem verifies the correction implemented by the correction subsystem. If the sector is not correctable by the correction subsystem, a device microprocessor optionally attempts correction using one or more programmed correction strategies off line. Prior to actual transfer of the sector to the host, the first CRC correction/checker unit is optionally utilized to check for any errors introduced by storage/retrieval operations concerning the data buffer.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 1A is a schematic block diagrammatic view of showing various connections of a utilization device to the error correction system of FIG. 1.

FIG. 8A is a diagrammatic view of sector organization of a buffer in connection with a write to device operation.

FIG. 8B is a diagrammatic view of sector organization of a buffer in connection with a read from device operation.

DETAILED DESCRIPTION OF TEE DRAWINGS

Figure 1:
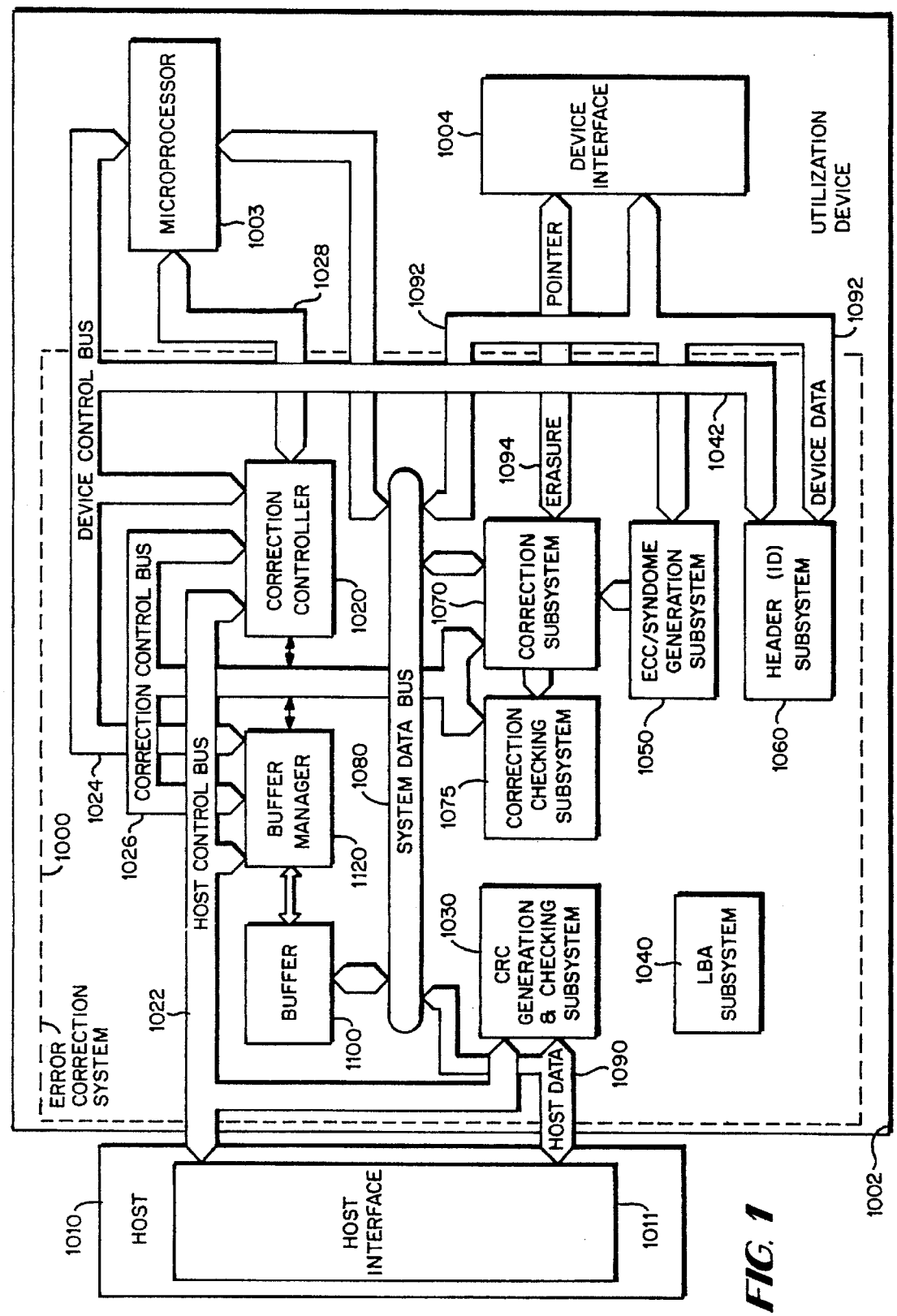
FIG. 1 is a schematic block diagrammatic view of an error correction system according to an embodiment of the invention, showing the error correction system connected to its utilization device and to a host.

FIG. 1 shows an error correction system 1000 (framed by broken lines) which is included in a utilization device 1002. Utilization device 1002 includes a device microprocessor 1003 and media recording/playback device 1005 through which data communication is established via utilization device interface 1004. Error correction system 1000 serves to correct data transmitted between host device 1010 (having host interface 1011) and utilization device 1002, as when host device 1010 writes data to a storage media handled by utilization device 1002 or as when host device 1010 reads data from the storage media handled by utilization device 1002. As used herein, utilization device 1002 is disk drive which handles rotating magnetic storage media.

As shown in FIG. 1 and otherwise herein, correction controller 1020 supervises and sequences operation of various constituent subsystems of error correction system 1000 and is involved with interfacing error correction system 1000 with host 1010; device microprocessor 1003, and device interface 1004. In the former regard, the following subsystems are supervised and sequenced by correction controller 1020: CRC generation and checking subsystem 1030; LBA subsystem 1040; ECC/Syndrome Generator subsystem 1050; header (ID) subsystem 1060; correction subsystem 1070; and, correction checker system 1075.

Error correction system 1000 also includes a system bus 1080 which is accessed by various subsystems, device microprocessor 1003, interface 1004, and buffer 1100. As hereinafter discussed, buffer 1100 is a memory utilized to store a plurality of sectors asynchronously undergoing various stages of processing. Buffer 1100 is controlled by buffer manager 1120, buffer manager 1120 being connected to correction controller 1020.

Correction controller is connected to a plurality of control buses as illustrated in FIG. 1, including host side control bus 1022; device side control bus 1024; correction control bus 1026; and, controller/microprocessor control bus 1028. Host side control bus 1022 is connected to CRC generation and checking subsystem 1030 and to buffer manager 1120. Device side control bus 1024 is also connected to device microprocessor 1003, buffer manager 1120; and header (ID) subsystem 1060. Correction control bus 1026 is also connected to buffer manager 1120; correction subsystem 1070; and correction checking subsystem 1075. Controller/ microprocessor control bus 1028 connects correction controller 1020 to device microprocessor 1003.

FIG. 1 also illustrates the following data buses: host data bus 1090 connected to host interface 1011; device data bus 1092; and erasure pointer bus 1094. Both device data bus 1092 and erasure pointer bus 1094 are connected to device interface 1004.

Although not specifically illustrated herein, it should be understood that controller 1020 is connected to various elements of the constituent subsystems of error correction system 1000 for carrying myriad control and timing signals, such as (for example) the numerous multiplexer select signals illustrated herein.

Figure 2:
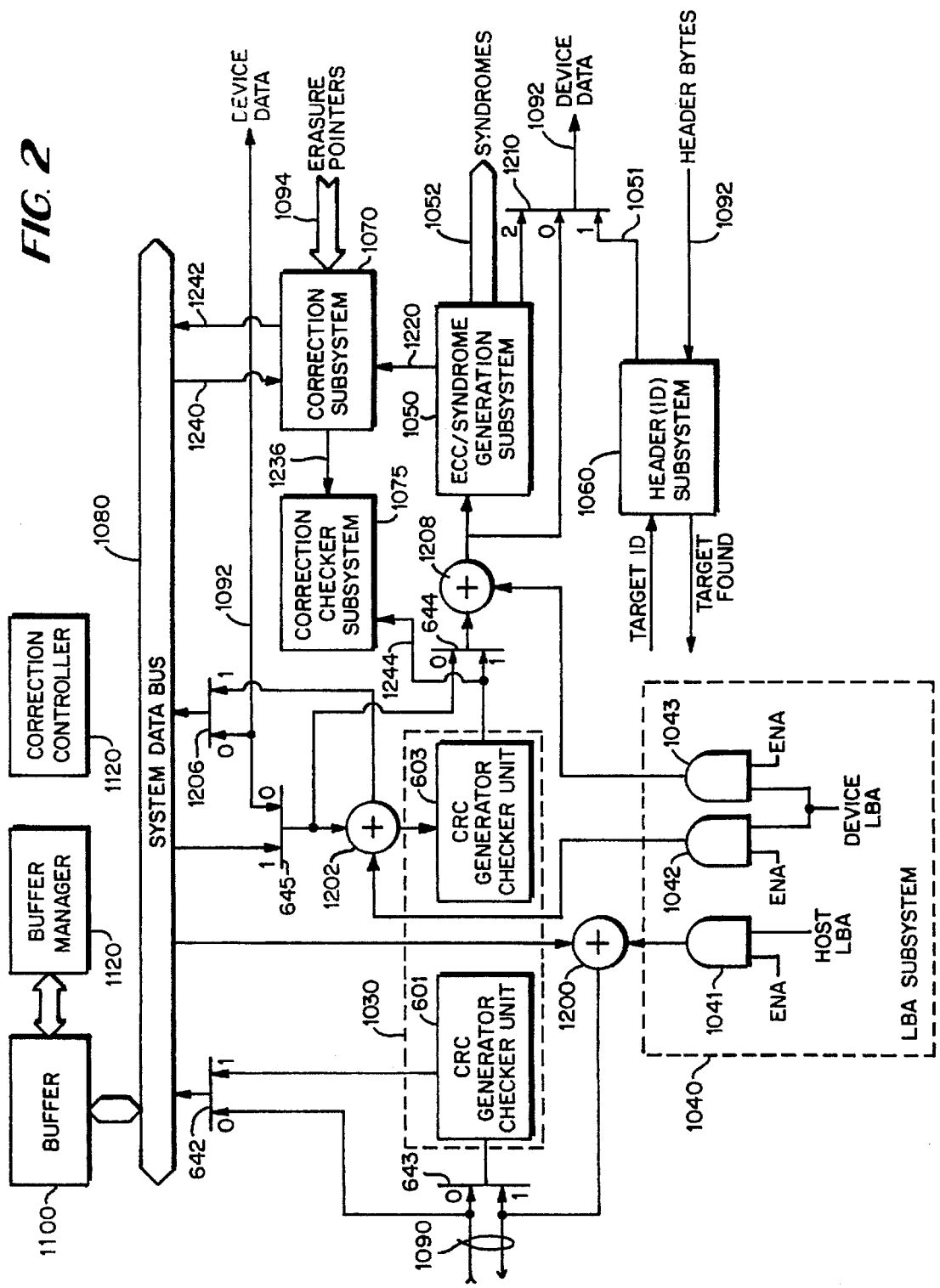
FIG. 2 is a schematic view showing more detail of the error correction system of FIG. 1, including connections between constituent subsystems of the error correction system.

FIG. 2 shows in more detail connections between the subsystems of error correction system 1000, particularly data connections. Data output from host interface 1011 is applied on host data bus 1090 to terminal 0 of MUX 643 and to terminal 0 of MUX 642. An output terminal of MUX 642 is connected to system bus 1080.

As shown in FIG. 2, CRC generation and checking subsystem 1030 includes a first CRC generator/checker unit 601 and a second CRC generator/checker unit 603. An input to CRC generator/checker unit 601 is connected to an output terminal of multiplexer (MUX) 643. An output terminal from CRC generator/checker unit 601 is connected to input terminal 1 of MUX 642, the output terminal of MUX 642 being connected to system bus 1080 as stated above.

Input terminal 1 of MUX 643 is connected to an output terminal of an adder 1200. The output terminal of adder 1200 is also to data input to host interface 1011 via host data bus 1090. A first input terminal of adder 1200 is connected to system bus 1080; a second input terminal of adder 1200 is connected to LBA subsystem 1040.

An input terminal of CRC generation/checker unit 603 is connected to an output terminal of adder 1202. A first input terminal of adder 1202 is connected to an output terminal of MUX 645. A second input a terminal of adder 1202 is connected to LBA subsystem 1040. Input terminal 1 of MUX 645 is connected to system bus 1080. Input terminal 0 of MUX 645 is connected by device data bus 1092 to interface 1004. The output terminal of adder 1202 is also connected to input terminal 0 of MUX 1206; input terminal 1 of MUX 1206 is connected by device data bus 1092 to interface 1004.

As further shown in FIG. 2, the ECC/syndrome generator subsystem 1050 has an input terminal connected to an output terminal of adder 1208. A first input terminal of adder 1208 is connected to an output terminal of MUX 644. Input terminal 0 of MUX 644 is connected to the output terminal of MUX 645; input terminal 1 of MUX 644 is connected to an output terminal of CRC generation/checker unit 603. A second input terminal of adder 1208 is connected to LBA subsystem 1040. The output terminal of adder 1208 is also connected to input terminal 0 of MUX 1210. An output terminal of MUX 1210 is connected to device data bus 1092. Syndromes generated by ECC/syndrome generator subsystem 1050 are applied on syndrome bus 1052 to device microprocessor 1003 (see FIG. 1A). ECC/syndrome generator subsystem 1050 also applies a syndrome signal on line 1220 to correction subsystem 1070. A line carrying ECC bytes generated by ECC/syndrome generator subsystem 1050 is connected to input terminal 2 of MUX 1210. In particular, the line carrying the signal WRITE DATA/ REDUNDANCY is connected to input terminal 2 of MUX 1210.

Correction subsystem 1070 receives the syndrome signal on line 1220 from ECC/syndrome generator subsystem 1050, as well as erasure pointers on bus 1094 from device interface 1004. Correction subsystem 1070 corrects multiple randomly-located error symbols on-the-fly—that is, correction of a sector is completed without interrupting the transfer of subsequent sectors into the buffer and without losing a revolution on the disk. Correction unit 1230 outputs an error signal ERR (i.e., error pattern) on line 1236 (which is applied as one input to correction checker subsystem 1070) and various status signals on correction bus 1026, including a signal UNC (which indicates that a codeword is uncorrectable). As explained hereinafter, when correction of a byte of a codeword is required, correction subsystem 1070 requests from buffer 1100 a byte requiring correction, which byte is transmitted to correction subsystem 1070 on line 1240. After the byte is corrected, the corrected byte is transferred back to buffer 1100 on line 1242. Both lines 1240 and 1242 are connected to system bus 1080. Reading a byte to be corrected from buffer 1100, correcting said byte and transferring it back to buffer 1100 as explained above is called read-modify-write operation.

As explained below, correction checker subsystem 1075 uses error patterns generated by correction subsystem 1070 and CRC check remainder bytes to confirm the correction implemented by correction subsystem 1070. For this purpose, correction checker subsystem 1075 is not only connected to receive on line 1236 the error signal ERR from correction unit 1230, but is also connected to receive the output from CRC generator/checker unit 603 on line 1244. Line 1244 is also shown as line 716 in FIG. 3A.

CRC generator/checker unit 603 generates CRC check remainder bytes by adding (at adder $703_1$ of FIG. 3A) its regenerated CRC bytes (shifted through the registers 705) to incoming CRC bytes. (The CRC check remainder is one example of an error signature. As used herein, the term "error signature" means any indication of errors, such as syndromes or remainders.) As each regenerated CRC byte is added to its corresponding incoming CRC byte to generate a CRC check remainder. Each CRC check remainder byte outputted from adder $703_1$ is shifted into register $705_k$ via MUX $708_k$. Thus, after formation of all CRC check remainder bytes, the registers 705 have the respective bytes of the CRC check remainder stored therein, so that the CRC check remainder bytes can be outputted on line 716 (also labeled as line 1244).

FIG. 2 shows that header (ID) subsystem 1060 is connected to receive header data bytes on device data bus 1092 from device interface 1004, and to apply header ECC bytes on line 1051 to input terminal 1 of MUX 1210. Header (ID) subsystem 1070 receives a signal TARGET ID from correction controller 1020, and applies a signal TARGET FOUND to correction controller 1020 (see FIG. 1A).

STRUCTURE: BUFFER

Buffer 1100 comprises a bank of memory devices, such as a bank of RAM chips or a bank or DRAM chips. Although illustrated herein as part of error correction system 1000, it should be understood that buffer 1100 may reside external to error correction system 1000. Therefore, error correction system 1000 may be provided without a buffer to a device manufacturer, permitting the device manufacturer to select and install a type of buffer in accordance with the manufacturer's own requirements and/or preferences. For this reason, as hereinafter described with reference to correction controller 1020, a means is provided for communicating to error correction system 1000 the manufacturer's selection of buffer type.

FIG. 8A and FIG. 8B generally show that, during operation, buffer 1100 usually has a plurality of sectors stored therein. FIG. 8A shows sectors $S_n$ - $S_{n+k}$ stored in buffer 1100 at a particular instance during a write from host to device operation. FIG. 8B shows sectors $S_{mn}$ - $S_{m+q}$ stored in buffer 1100 at a particular instance during a read from device to host operation, including a sector $S_{m+c}$ undergoing correction. Each sector S is illustrated with gradation markings on a left margin thereof to represent byte locations. Buffer manager 1120 maintains an address pointer for referencing the currently addressed byte of each sector, for example pointer $P_{S(n)}$ for sector $S_n$ and pointer $P_{s(n+k)}$ for sector $S_{n+k}$.

Although illustrated as such for simplicity in FIG. 8A and FIG. 8B, it should be understood that the physical locations of sectors S in buffer 1100 are not necessarily related to order of input into buffer 1100 or order of readout from buffer 1100. Importantly, operations are conducted asynchronously with respect to sectors S in buffer 1100. For example, in the read from device to host operation depicted by FIG. 8B, sector $S_m$ is being read from device 1002; sector $S_{m+c}$ is being corrected, and sector $S_{m+q}$ is being transmitted to host 1010, with each of these operations being asynchronous although overlapped with respect to the others.

STRUCTURE: CORRECTION CONTROLLER

As indicated above, correction controller 1020 controls interfacing of error correction system 1000 with both host 1010 and utilization device 1002, as well as supervises and sequences operation of various constituent subsystems of error correction system 1000. FIG. 1A particularly shows communication of correction controller 1020 with device microprocessor 1003, as well as a set 1029 of mode select registers provided in correction controller 1020. The plurality of mode select registers in set 1029 are set in accordance with user (e.g., device manufacturer) input to device microprocessor 1003 (as communicated by signals on controller-microprocessor control bus 1028). For example, the user can specify the type of memory being utilized for buffer 1100 (register BUFFER TYPE), whether CRC bytes are to be appended to sectors in buffer 1100 (register APPEND BUFFER CRC); the number of CRC bytes to be appended to a sector in buffer 1100 (register # BUFFER CRC BYTES); the number of device CRC bytes to be appended to a sector (register # DEVICE CRC BYTES); a number of burst error bytes which correction subsystem 1070 should monitor for reporting to correction controller 1020 (register MONITOR BURST LENGTH); a number of errors per codeword which correction subsystem 1070 should monitor for reporting to correction controller 1020 (register MONITOR CODEWORD ERROR NUMBER); a flag indicative of whether a feature known as microprocessor supplemental correction is to be implemented (register µP SUPPLEMENTAL CORRECTION OPTION); a flag indicative of whether detection for wrong sector transfer is to be implemented (register LBA OPTION); a number of bytes involved in wrong sector detection (register # LBA BYTES); and a flag indicating whether the operator does not know the wrong sector (LBA) value but wishes to detect the same (register DETECT LBA).

STRUCTURE: CRC GENERATOR/CHECKER SUBSYSTEM

As shown in FIG. 2, CRC generator/checker subsystem 1030 includes two units, particularly CRC generator checker unit 601 and CRC generator checker unit 603.

When a buffer CRC option is selected (see register APPEND BUFFER CRC in FIG. 1A), CRC generator checker unit 601 serves to add a programmable number of CRC bytes (known as "buffer CRC" bytes or "primary CRC" bytes) to a sector being transferred from host 1010 to buffer 1100. The programmable number of buffer CRC bytes is determined by the value stored in mode select register # BUFFER CRC BYTES in correction controller 1020 (see FIG. 1A).

During a write from host to device (media) operation, a sector being transferred to the media is transmitted to CRC generator checker unit 603. If the buffer CRC option is selected, CRC generator checker unit 603 regenerates CRC over the sector data obtained from the buffer, and compares its regenerated CRC with the CRC obtained from the buffer 1100. Thus, CRC generator checker unit 603 serves to check buffer 1100. The CRC generated by CRC generator checker unit 603 is used as device CRC for actually recording on the media.

During a read from device (media) operation, CRC generator checker units 601 and 603 essentially switch roles. That is, during a read from device (media) operation, CRC generator checker unit 603 optionally appends buffer CRC prior to storage of the read sector in buffer 1100. When the sector is being transferred from buffer 1100 to host 1010, CRC generator checker unit 601 serves to check whether the sector is correctly obtained from buffer 1100.

Both CRC generator/checker unit 601 and CRC generator/checker 603 essentially have the same structure.

Figure 3:
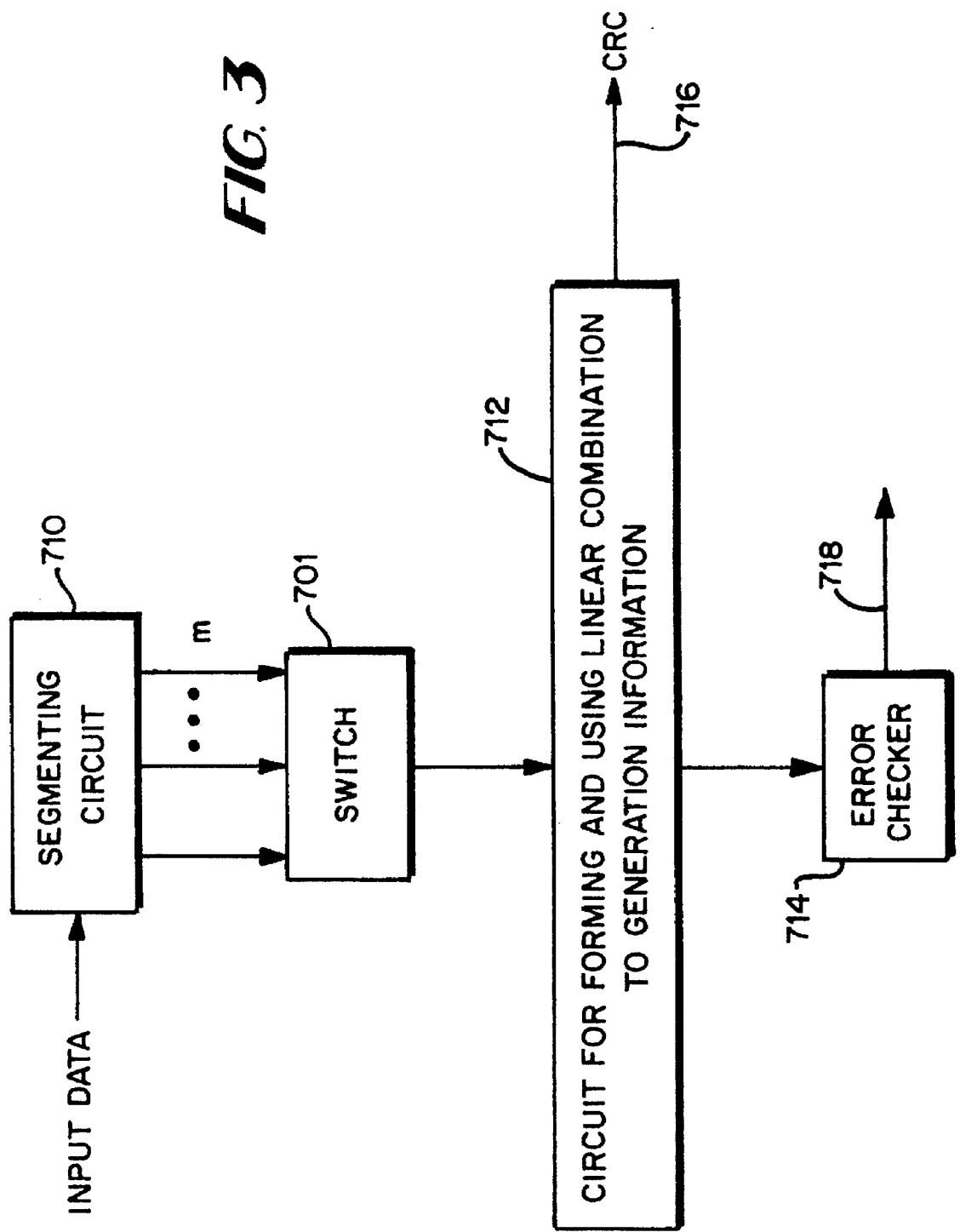
FIG. 3 is a schematic block diagrammatic view of a CRC generator/checker unit of a CRC generation/checker subsystem of the error correction system of FIG. 1.
Figure 3A:
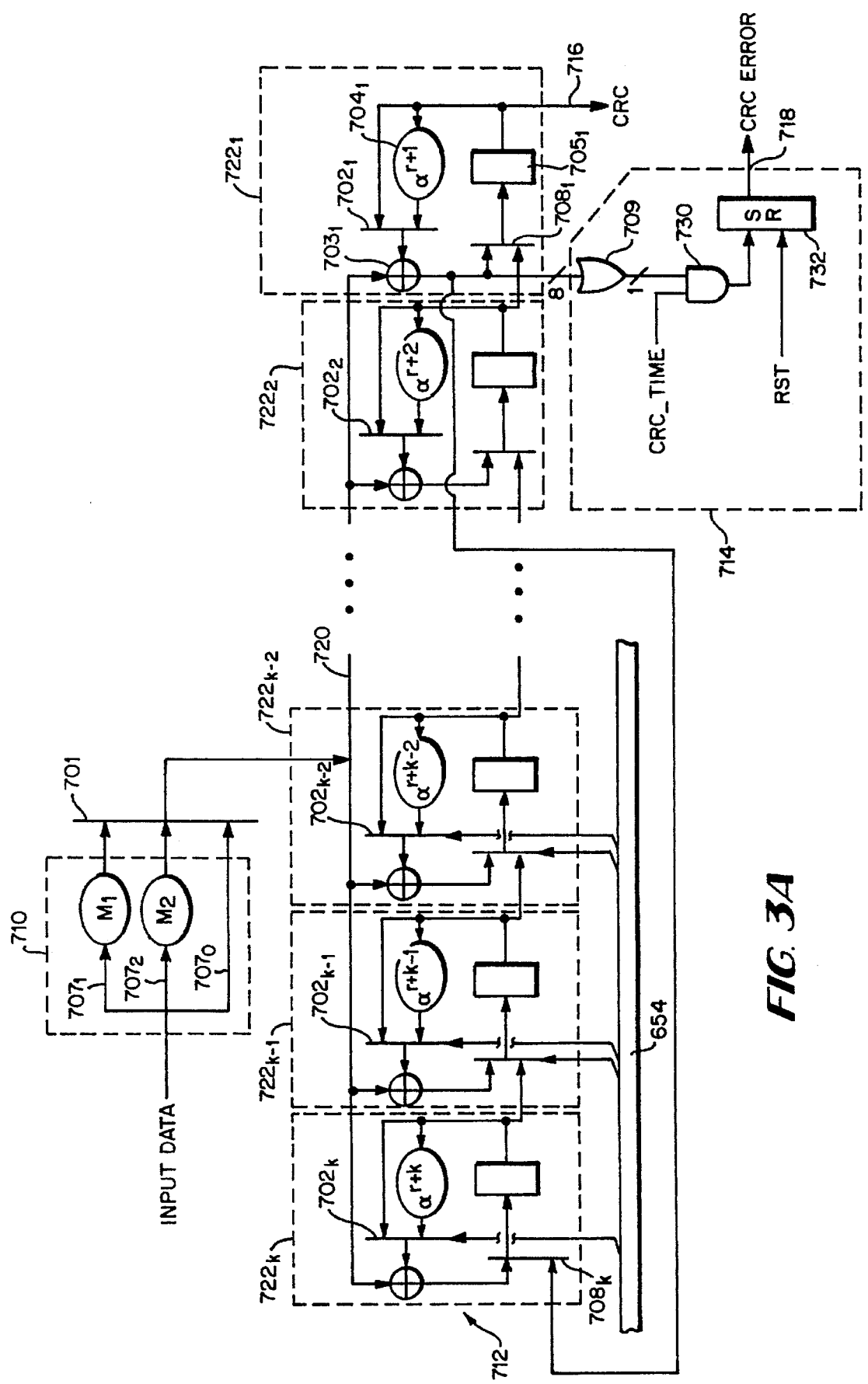
FIG. 3A is a detailed schematic block diagrammatic view showing the CRC generator/checker unit of FIG. 3 in more detail.

FIG. 3 generally shows structure of an exemplary one of the CRC generator/checker units 601, 603. Each unit 601, 603 basically includes a segmenting circuit 710; a switch or multiplexer 701; a circuit 712 for forming and using a linear combination of user data sub-streams to generate CRC information; and, an error checker circuit 714.

Referring again to FIG. 3, segmenting circuit 710 serves to segment an input stream of user data into a plurality m of sub-streams for application to switch 701. Switch 701 selects from the plurality of user data sub-streams in accordance with clock cycle and applies the selected user data sub-stream to circuit 712. The resultant CRC information, preferably in the form of CRC bytes, is outputted on parallel CRC bus 716. When CRC generator/checker unit 601 or 603 is employed to check received CRC information previously generated on the basis of received data, the previously generated CRC information is compared by error checker 714 with verification CRC information currently generated (with respect to the same user data) by circuit 712. Should the previously generated and currently generated verification CRC information differ, an error signal is generated on CRC error line 718.

FIG. 7A shows structural details of one particular implementation of CRC generator/checker unit 601 or 603, and particular an implementation wherein m=3. Accordingly, segmenting circuit 710 of FIG. 7A is shown to include three sub-stream lines $707_0$, $707_1$, $707_2$. For reasons hereinafter discussed, sub-stream line $707_1$ and $707_2$ have multipliers $M_1$ and $M_2$ connected thereon. Switch 701 is a three-input multiplexer having input selected by controller 626 (via a control bus). An output port of multiplexer 701 is connected to apply the sub-stream selected thereby to adder input bus 720.

As shown in FIG. 7A, circuit 712 comprises k number of sub-circuits $722_1 - 722_k$ for generating as many as k bytes of CRC information with respect to the linear combination of sub-streams. As explained below, each sub-circuit 722 is a divider having a divisor which is a power of α. Each sub-circuit 722 comprises an adder input multiplexer 702; an adder 703; a multiplier 704; a register 705 for storing CRC information; and, a register input multiplexer 708. Each adder 703 has a first input port, a second port, and an output port. The first port of each adder 703 is connected to adder input bus 720 so that the plurality of sub-streams can be multiplexed thereto. Each multiplier 704 has an output port thereof selectively connected (via a first input port of associated multiplexer 702) to the second input port of its associated adder 703. Each register 705 has an input port connected to the output port of associated adder 703 and its output port is selectively connected (via a first input port of associated multiplexer 702) to the second input port of the adder 703. Each register 705 stores CRC information in the form of a CRC byte which is related to an error correcting code. Each of the multiplexers 702 and 708 are controlled by controller 626 (for example, via control bus 654).

From the foregoing it is understood that sub-circuits 722 are numbered from a first sub-circuit $722_1$ to a $k^{th}$ sub-circuit $722_k$. Registers 705 of the sub-circuits 722 are connected so that CRC information stored therein can be rightwardly shifted. The rightward shift occurs after the n clock cycles executed to generate the CRC bytes in registers 705. After the n clock cycles are executed to generate the CRC bytes, the CRC bytes in registers 705 are shifted rightwardly a desired number of clocks (as input to controller 626), one register (e.g., one sub-circuit) per clock. For example, considering the operation of first CRC generator/checker 601, if an input value of 4 is inputted at input port $627_1$ of controller 626, during a first shift clock cycle the CRC byte in register $705_1$ is shifted out on CRC bus 716; the CRC byte in register $705_2$ is shifted into register $705_1$; the CRC byte in register $705_3$ is shifted into register $705_2$; and so forth. Such shifting continues for four shift clock cycles, so that the CRC values initially in registers $705_1 - 705_4$ are ultimately shifted out to CRC bus 716.

The values of the multipliers 704 are chosen so that the multiplier multiplies by a power of a field element α, the power being r+1 for the multiplier of the first sub-circuit $722_1$ and r+k for the multiplier of the $k^{th}$ sub-circuit $722_k$.

The output port of adder $703_1$ is connected to error checker circuit 714. As illustrated in FIG. 7A, error checker circuit 714 comprises an 8-input OR gate 709 which is connected to the output port of adder $703_1$. Error checker circuit 714 further includes and AND gate 730 and an R/S flip-flop or latch 732. An output pin of OR gate 709 is connected to a first input pin of AND gate 730, a second input pin of AND gate 730 being connected to receive a signal CRC_TIME from controller 626. An output pin of AND gate 730 is connected to a set pin of flip-flop 732; a reset pin of flip-flop 732 receives a signal RST from controller 626. Since adder $703_1$ is involved in verifying previously-generated CRC information with currently generated CRC information in the manner hereinafter described, sub-circuit $722_1$ is denominated the "comparison" sub-circuit.

CRC generator/checker subsystem 1030 is described in yet further detail by the following patent applications, both of which are incorporated by reference: U.S. patent application Ser. No. 08/325,717 entitled "CYCLIC REDUNDANCY CHECK METHOD AND APPARATUS"; U.S. patent application Ser. No. 08/147,865 entitled "DUAL PURPOSE CYCLIC REDUNDANCY CHECK".

STRUCTURE: ECC/SYNDROME GENERATOR SUBSYSTEM

Figure 4:
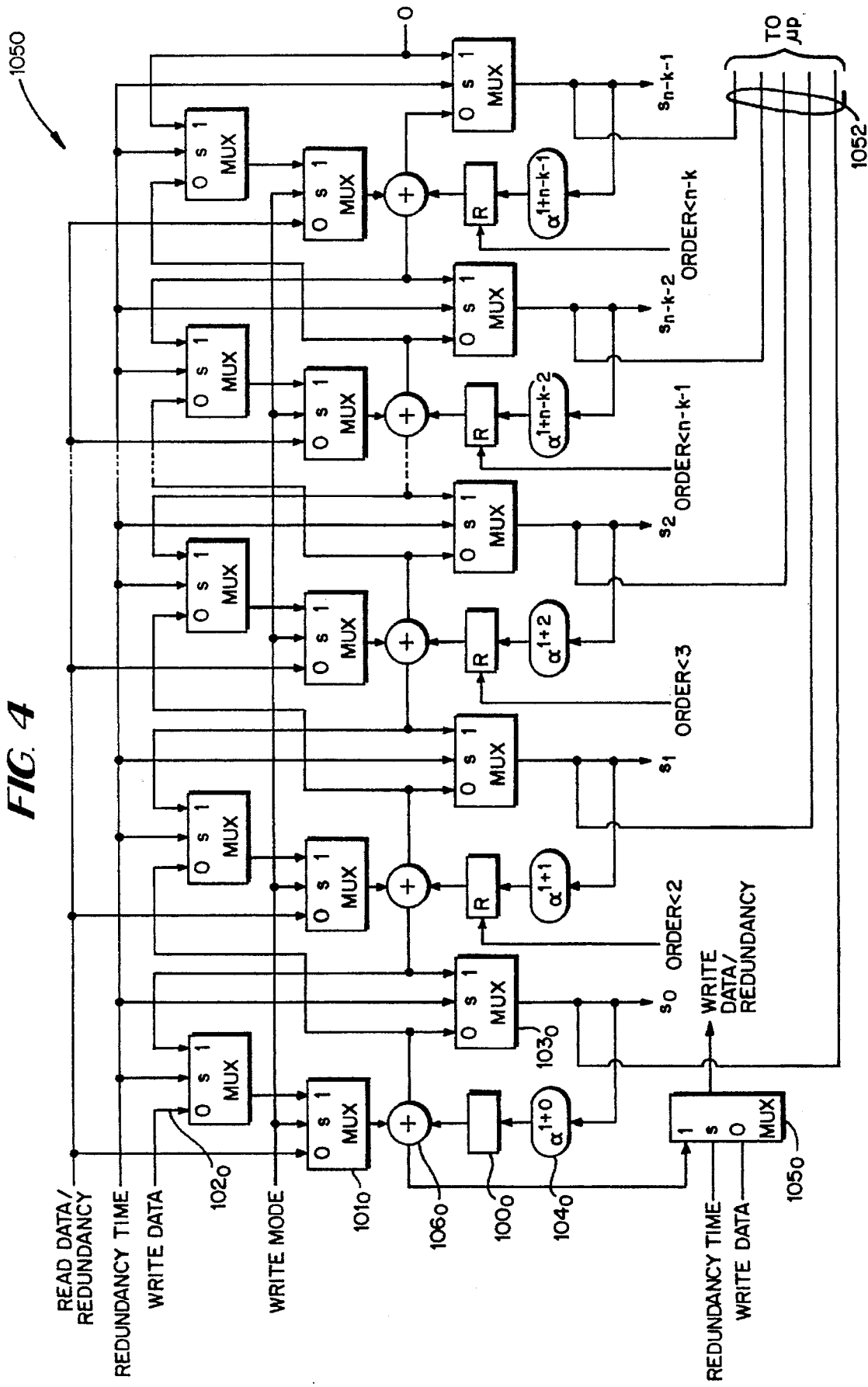
FIG. 4 is a schematic block diagrammatic view of a ECC/syndrome generator subsystem in accordance with an embodiment of the invention.

FIG. 4 shows in more detail the ECC/syndrome generator subsystem 1050. ECC/syndrome generator subsystem 1050 includes a bank of ECC/syndrome registers 100; a bank of MUXes 101; a bank of MUXes 102; a bank of MUXes 103; a bank of multipliers 104; a MUX 105; and, a bank of adders 106. Each like-subscripted set of elements of ECC/syndrome generator subsystem 1050 is referred to as a "slice". For example, register $100_0$, MUXes $101_0$, $102_0$, $103_0$, and register $100_0$ are included in a first slice of subsystem 1050.

ECC/syndrome generator subsystem 1050 is described in yet further detail by U.S. patent application Ser. No. 08/124,936 of Zook and Glover, filed Sep. 21, 1993 and entitled "PROGRAMMABLE REDUNDANCY/SYNDROME GENERATOR", and which is incorporated herein by reference.

Figure 4A:
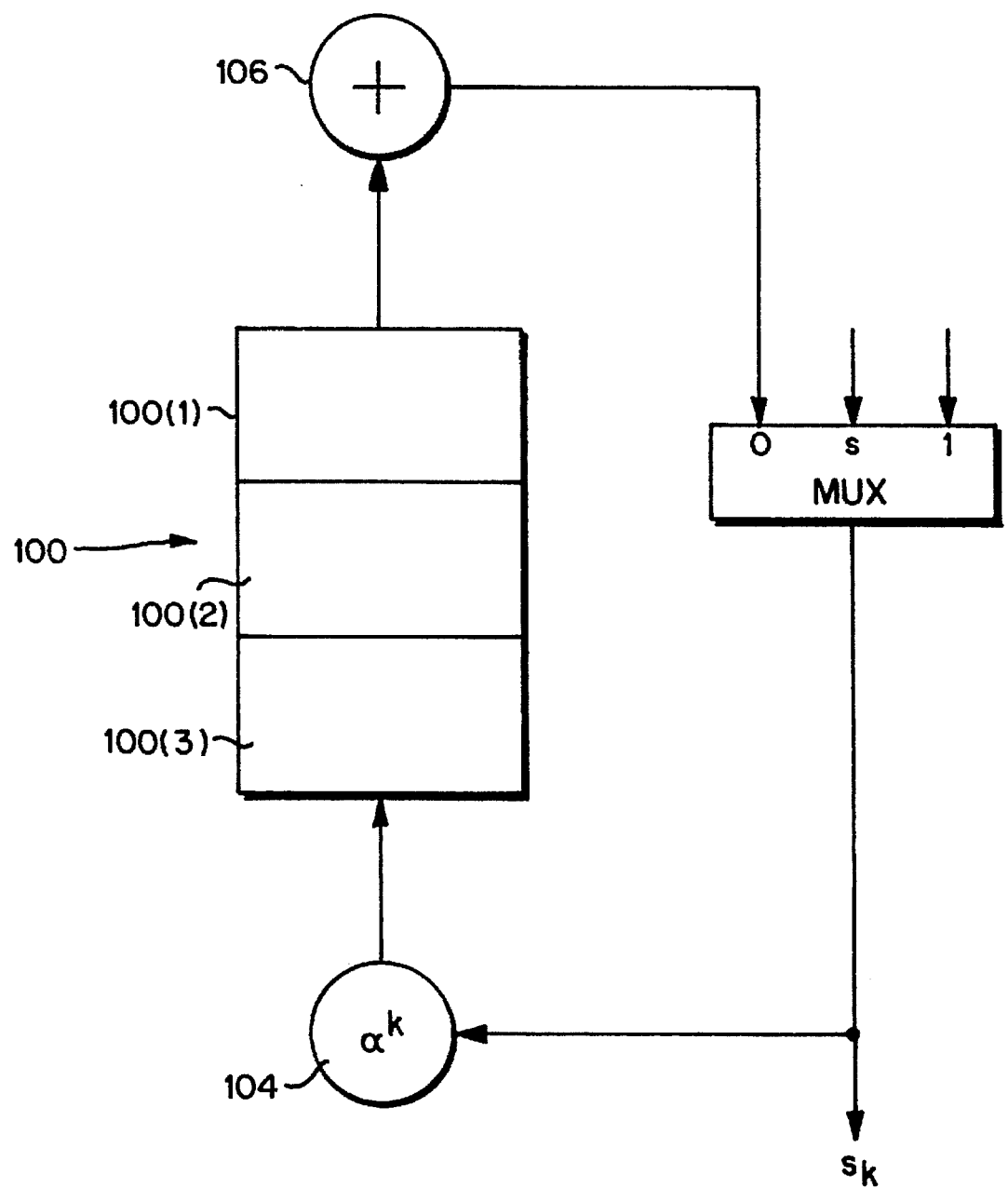
FIG. 4A is a schematic block diagrammatic view for explaining how the ECC/syndrome generator subsystem of FIG. 4 can be operated in an interleaved error correction system.

FIG. 4A illustrates how subsystem 1050 of FIG. 4 is configured for handling interleaved data, particularly three interleaves. For the interleave configuration, each register 100 functions as a shift register divided into three partitions—one partition for each interleave. Accordingly, summation for each interleave occurs in a corresponding one of the circularly rotating register partitions.

STRUCTURE: CORRECTION SUBSYSTEM

Figure 5:
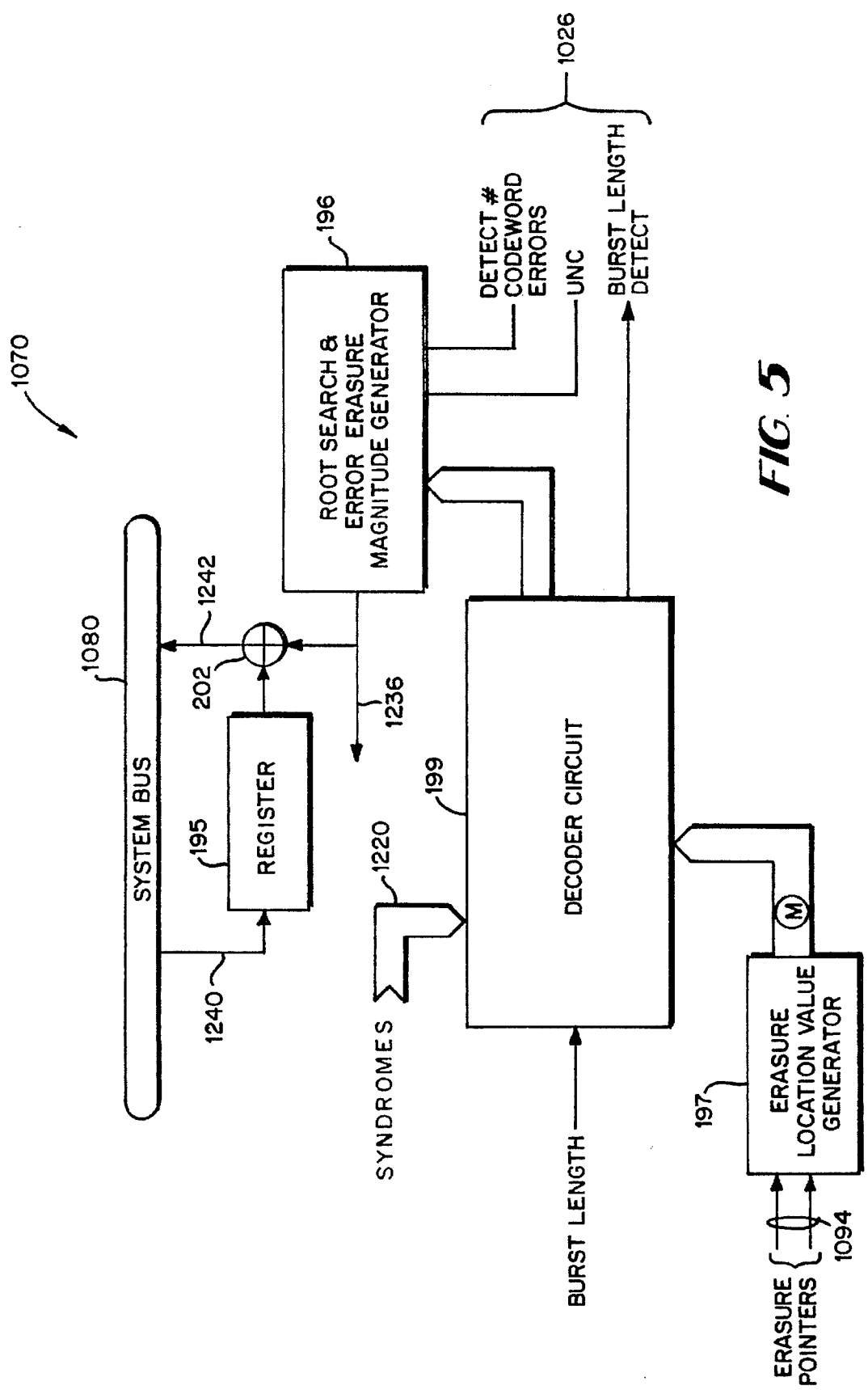
FIG. 5 is a schematic block diagrammatic view of correction unit and its pertinent connections to various other subsystems in accordance with an embodiment of the invention.

FIG. 5 shows correction subsystem 1070 and its connection to system data bus 1080 and erasure pointer bus 1094. Correction subsystem 1070 comprises a one byte register 195; a root search and error/erasure magnitude generator 196; an erasure location value generator 197; a decoder circuit 199; and, an adder 202.

Erasure location value generator 197 is connected to receive the erasure pointers from device interface 1004 on erasure pointer bus 1094. Location values of the erasures are applied to decoder circuit 199. Decoder circuit 199 also receives syndromes on line 1220 from ECC/syndrome generation subsystem 1050.

System bus 1080 is connected by line 1240 to an input terminal of register 195 and by line 1242 to an output terminal of adder 202. A first input terminal of adder 202 is connected to register 195 to receive the byte-requiring-correction. A second input terminal of adder 202 is connected to root search and error/erasure magnitude generator 196 to receive an error pattern on line 1236 therefrom.

The operation of decoder circuit 199 is now briefly summarized. After a series of error locator iterations, decoder circuit 199 obtains final values for t m-bit coefficients of an error locator polynomial σ. Upon completion of the series of error locator iterations for a codeword, decoder circuit 199 executes a series of error magnitude iterations to generate an error evaluator polynomial ω for the codeword. The coefficients of the error evaluator polynomial ω are transmitted to the root search and error/erasure magnitude generator 196 where the error magnitude E is calculated. After calculation of the error magnitude E, the error magnitude E is added to the original data (i.e., byte requiring correction) at adder 202, resulting in the corrected byte for the codeword. In the buffering scheme herein illustrated, the corrected byte is then returned to buffer 1100 on line 1242.

As further described herein, correction subsystem 1070 generates a plurality of signals for application to correction controller 1020 (on correction control bus 1026). Included among these signals are signals BURST LENGTH DETECT (which indicates that an error burst of length BURST LENGTH [see register MONITOR BURST LENGTH in correction controller 1020 in FIG. 1A]); a signal DETECT # CODEWORD ERRORS (which indicates the number of errors detected per codeword [see register MONITOR CODEWORD ERROR NUMBER in correction controller 1020 in FIG. 1A]); a register MONITOR TOTAL ERROR COUNT indicating the total number of errors detected per sector (shown in FIG. 1A); and a signal UNC (i.e., codeword is uncorrectable).

An important aspect of the invention is on-the-fly error correction of randomly-located error symbols in the codeword. Moreover, in the preferred embodiment, correction is accomplished in less than one sector time.

Correction subsystem 1070 is described in yet further detail by the following patent applications, both of which are incorporated by reference: U.S. patent application Ser. No. 08/147,650 entitled "REED SOLOMON DETECTOR"; U.S. patent application Ser. No. 08/326,164 entitled "REED SOLOMON DECODER".

STRUCTURE: CORRECTION CHECKER SUBSYSTEM

Figure 6:
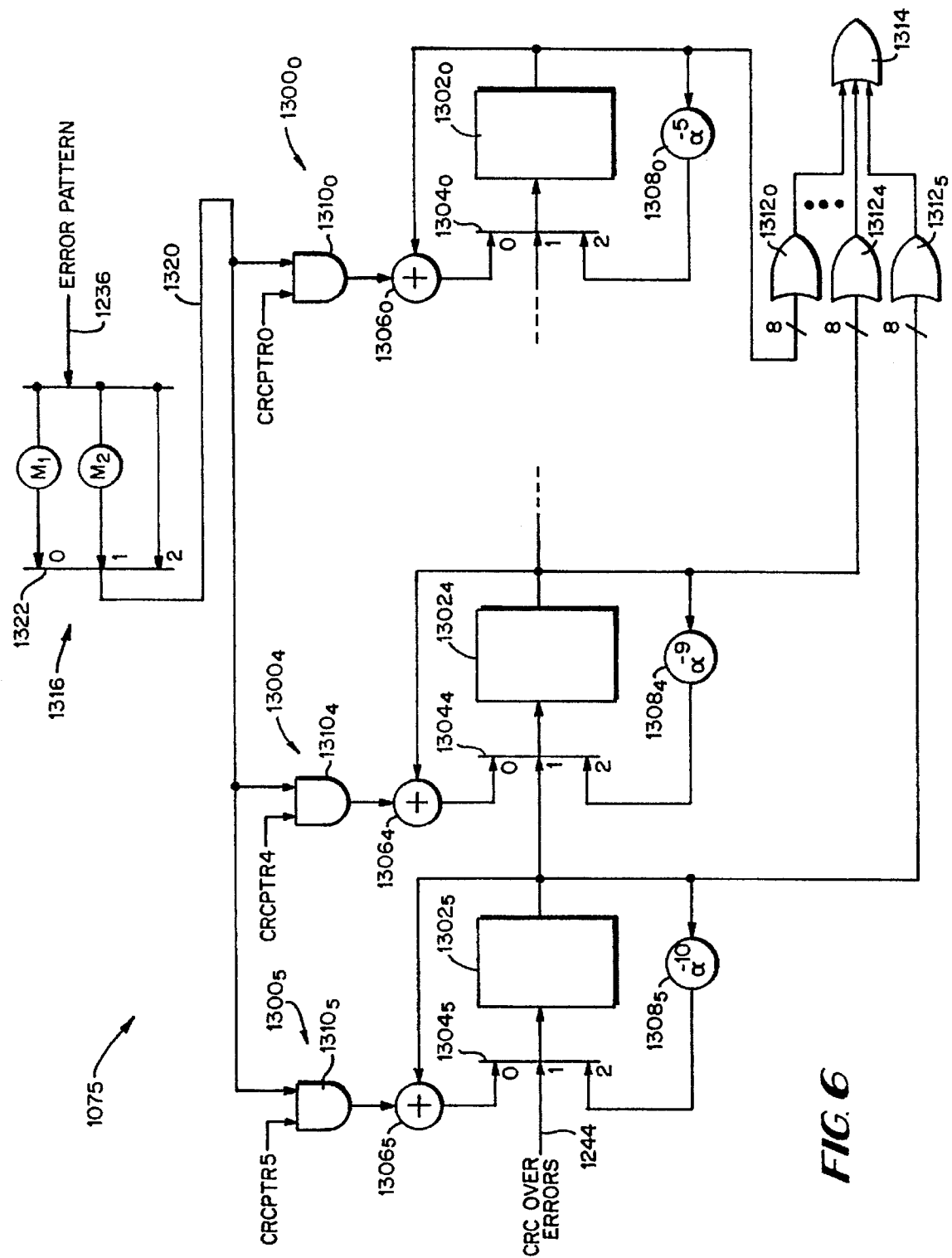
FIG. 6 is a schematic block diagrammatic view of a correction checker subsystem in accordance with an embodiment of the invention.

As further shown in FIG. 6, correction checker subsystem 1075 includes six stages $1300_0$ - $1300_5$, each stage including a correspondingly subscripted register 1302; a register input MUX 1304; an adder 1306; a feedback multiplier 1308; a timing control AND gate 1310; and, a zero-checking output OR gate 1312. Correction checker subsystem 1075 further includes an all-byte zero checking OR gate 1314 and a segmentation compensation circuit 1316. Compensation circuit is connected to receive the error pattern signal applied on line 1236 from error correction subsystem 1070, and outputs a compensated error pattern on line 1320.

Register $1302_5$ has its input terminal connected to the output terminal of its corresponding MUX $1304_5$. MUX $1304_5$ has its first input terminal 0 connected to an output terminal of adder $1306_5$; its second input terminal 1 connected to line 1244; and its third input terminal 2 connected to an output terminal of feedback multiplier $1308_5$. Line 1244 is connected to CRC generation/checker unit 603 for applying check remainder CRC bytes (i.e., CRC bytes only over the error) to register $1302_5$ (via MUX 1302).

Registers $1302_4$ - $1302_0$ of the remaining stages are similarly connected, except that the second input terminal 1 for MUXes $1304_4$ - $1304_0$ are connected to the output terminal of the next upstream register 1302. For example, input terminal 1 of MUX $1304_4$ is connected to the output terminal of register $1302_5$. In this way, the bank of registers 1302 function as a shift register, so that the CRC check remainder bytes, applied a byte at a time to correction checker 1075, can be loaded into registers 1302. In such loading process, the first byte is stored in register $1302_0$, the second byte in register $1302_1$, and so forth with the last byte stored in register $1302_5$.

In the above regard, correction checker subsystem 1075 is shown as including six stages, but more stages may be included in order to facilitate the programmable number of CRC bytes utilized by error correction system 1000. When the number of stages 1300 exceeds the number of CRC remainder bytes outputted from CRC generation/checker 603, zeros are loaded into the higher staged (i.e, higher subscripted) registers 1302.

The output terminal of each register 1302 is also connected to an input terminal of its respective feedback multiplier 1308, to a first input terminal of its associated adder 1306, and to input terminals of its associated OR gate 1312. An output terminal of each adder 1308 is connected to the third input terminal 2 of MUX 1304. The second input terminal of each adder 1306 is connected to an output terminal of its associated AND gate 1310. The output terminal of each adder 1306 is connected to the first input terminal 0 of its associated MUX 1304.

A first input terminal of each AND gate 1310 is connected to receive the compensated error pattern applied on line 1320. A second input terminal of each AND gate 1310 is connected to a timing line (i.e., pointer) which turns on only when the compensated error pattern applied on line 1320 affects the CRC byte loaded into the register 1302 for its stage. For example, the second input terminal of AND gate $1310_0$ is connected to line CRCPTR0; the second input terminal of AND gate $1310_1$ is connected to line CRCPTR1; and so forth.

The segmentation compensation circuit 1316 of FIG. 6 is seen to resemble the segmentation circuit 710 (see FIG. 3A) of the CRC generator/checker units. In this regard, segmentation compensation circuit 1316 includes three branched lines, with two of the branched lines having multipliers $M_1$ and $M_2$ corresponding to multipliers of FIG. 3A. All three branched lines are connected to respective input terminals of MUX 1322.

Each zero-checking output OR gate 1312 is connected to all bits of the byte output from its associated register 1302, and accordingly produces a non-zero output when any of the bits are non-zero. The output terminals of all OR gates 1312 are connected to input terminals of all-byte zero checking OR gate 1314. The output terminal of OR gate 1314 produces a non-zero signal only when correction checker subsystem 1075 is unable to verify correction by the correction subsystem 1060 (meaning that the error is uncorrectable).

As shown in FIG. 6, correction checker subsystem 1075 receives the error pattern in parallel and using an α basis representation. It should be understood, however, that correction checker subsystem 1075 can be implemented serially. Moreover, if input to correction checker subsystem 1075 is provided in another basis representation (e.g., β basis representation), basis conversion can be performed.

STRUCTURE: HEADER (ID) SUBSYSTEM

Figure 7:
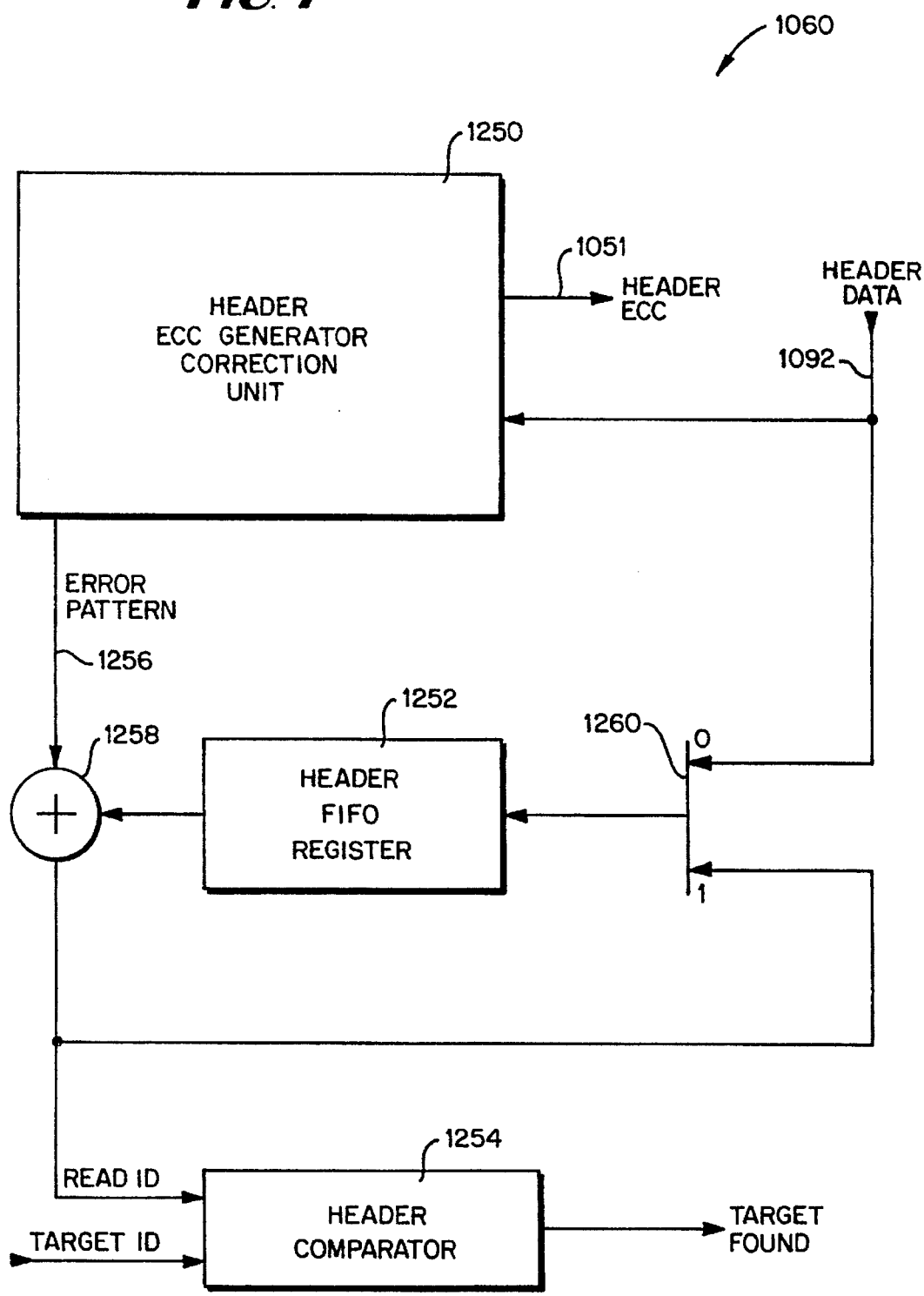
FIG. 7 is a schematic block diagrammatic view of a header ECC generator/corrector subsystem in accordance with an embodiment of the invention.

As further shown in FIG. 7, header (ID) subsystem 1070 includes a header ECC generator corrector unit 1250; header FIFO register 1252; header comparator 1254; adder 1258; and header MUX 1260. Header ECC generator corrector unit 1050 receives header data bytes on device data bus 1092 from device interface 1004) and outputs both a signal HEADER ECC on line 1051 (applied to input terminal 1 of MUX 1210) and a header error pattern signal on line 1256. The signal on line 1256 is applied to a first input terminal of adder 1258, a second input terminal of adder 1258 being connected to an output terminal of header FIFO register 1252. An output terminal of adder 1258 is connected to input terminal 1 of FIFO input MUX 1260. Input terminal 0 of MUX 1260 is connected to receive header data bytes on device data bus 1092. An output terminal of MUX 1260 is connected to the input terminal of header FIFO register 1252.

The output terminal of adder 1258 is also connected to a first input terminal of header comparator 1254. A second input terminal of header comparator 1254 is connected to receive a signal TARGET ID from correction controller 1020. An output signal TARGET FOUND from header comparator 1254 is applied to correction controller 1020 for indicating a match between a target header ID requested by controller 1020 and a header ID obtained from the storage media.

Header (ID) subsystem is described in yet further detail by the following patent applications, both of which are incorporated by reference: U.S. patent application Ser. No. 08/325,850 entitled "BURST ERROR CORRECTOR"; U.S. patent application Ser. No. 08/148,068 entitled "BURST ERROR CORRECTOR".

STRUCTURE: LBA SUBSYSTEM

LBA subsystem 1040 is used for detecting transfer of a wrong sector using logical block address (LBA). As shown in FIG. 2, LBA subsystem includes three AND gates, particularly AND gate 1041; AND gate 1042; and, AND gate 1043. An output terminal of AND gate 1041 is connected to a second input terminal of adder 1200. An output terminal of AND gate 1042 is connected to a second input terminal of adder 1202. An output terminal of AND gate 1043 is connected to a second input terminal of adder 1208. Each AND gate 1041, 1042, and 1043 has a respective ENA signal applied to a first input thereof, the ENA signal being generated by correction controller 1020. A second input terminal of AND gate 1041 is connected to receive a signal herein denominated as "HOST LBA"; second input terminals of AND gates 1042 and 1043 are connected to receive a signal herein denominated as "DEVICE LBA". Further structure and operation of LBA subsystem is described in U.S. patent application Ser. No. 08/310,973 filed Sep. 23, 1994 and entitled "A METHOD AND APPARATUS FOR DETECTING THE TRANSFER OF A WRONG SECTOR", which is incorporated herein by reference.

STRUCTURE: UTILIZATION DEVICE

As an aid to understanding the present invention, brief reference is now made to various structural aspects of utilization device 1002 other than error correction system 1000. As shown in FIG. 1A and previously explained, utilization device 1002 includes microprocessor 1003 and device interface 1004 (which interfaces with the media handled by device 1002). As shown in FIG. 1A, microprocessor 1003 is connected to error control system 1000 by (among other things) controller-microprocessor control bus 1028 and syndrome bus 1052.

Device interface 1004 includes, among its many other components, a detector unit 1004A; a RLL demodulator 1004B; a sync detector 1004C; a RLL modulator 1004D; a sync generator 1004E; a switch or MUX 1004F, and, a recording device interface 1004G. Also shown in FIG. 1A is recording/playback device (e.g., head(s)) 1005. Sync detector 1004C is connected to receive the binary data signal output from detector unit 1004A and to output a sync detect signal to RLL demodulator 1004B. The RLL modulator 1004D is connected to receive the outgoing signal from device data bus 1092, and to apply an RLL modulated signal to input terminal 1 of MUX 1004F. Sync generator 1004F outputs a sync signal to input terminal 1 of MUX 1004F. The output terminal of MUX 1004F is connected to recording device interface 1004G. The output of recording device interface 1004G is connected to recording/playback device 1005. The analog signal produced by recording/playback device 1005 is applied as signal RD SIGNAL to the input of detector unit 1004A.

Detector unit 1004A receives the analog read signal RD SIGNAL from the media (e.g., from recording/playback device 1005), and outputs both binary data to RLL modulator 1004B and (when appropriate) an erasure pointer for inclusion on erasure pointer bus 1094. The erasure pointer outputted by detector unit 1004A occurs when detector unit 1004A has doubts concerning the integrity of the signal it receives (e.g., low amplitude or noise). RLL modulator 1004B outputs the data signal for application to device data bus 1092. If RLL modulator 1004B encounters an abnormal condition such as an illegal or invalid binary sequence, RLL modulator 1004B outputs an erasure pointer signal for inclusion on erasure pointer bus 1094.

STRUCTURE: MEDIA FORMAT

Figure 10:
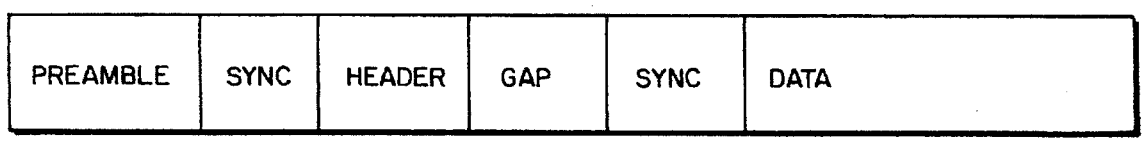
FIG. 10 is a diagrammatic view showing a format of a sector recorded on a medium handled by the utilization device with which the error correction system of FIG. 1 is exemplarly operated.

As a further aid for understanding principles of the present invention, attention is directed to FIG. 10 for a simplified illustration of the format of a sector recorded on magnetic disk. As shown in FIG. 10, the sector includes a preamble, which is followed by a first "sync" or synchronization mark. The sync mark is typically a predefined bit pattern extending for a plurality of bytes. The first sync mark is immediately followed by a header field. The header field includes, among other things, a unique identification or ID for the sector. The header field is followed by a gap. The gap is, in turn, followed by a second sync mark. The second sync mark is immediately followed by a (user) data field.

Sector ID information included in the header field is also referred to herein as header data. Header data is not to be confused with user data, since correction for each occurs separately. In this regard, a special subsystem (the header (ID) subsystem 1060) is utilized for correcting header data, while correction subsystem 1070 corrects user data. Multiple random error symbols located in the ID field are corrected on-the-fly within a few clock cycles following the ID field.

In the illustrated embodiment, the length and definition of the sync mark is programmable. In this regard, device interface 1004 includes its own controller which, like correction controller 1020, has a plurality of mode selection registers which are set by microprocessor 1003. As understood by analogy to the mode select registers of correction controller 1020, the sync-related mode select registers permit the operator or user to specify the particular bit pattern to be utilized for the sync mark on the media. In this regard, for an illustration of a fault-tolerant sync detection scheme, see (for example), Glover, Neal and Dudley, Trent, *Practical Error Correction Design for Engineers,* 2nd Edition, (incorporated herein by reference) [specifically pages 250 to 255 thereof, which are incorporated by reference].

OPERATION: WRITE FROM HOST: OVERVIEW

Figure 11:
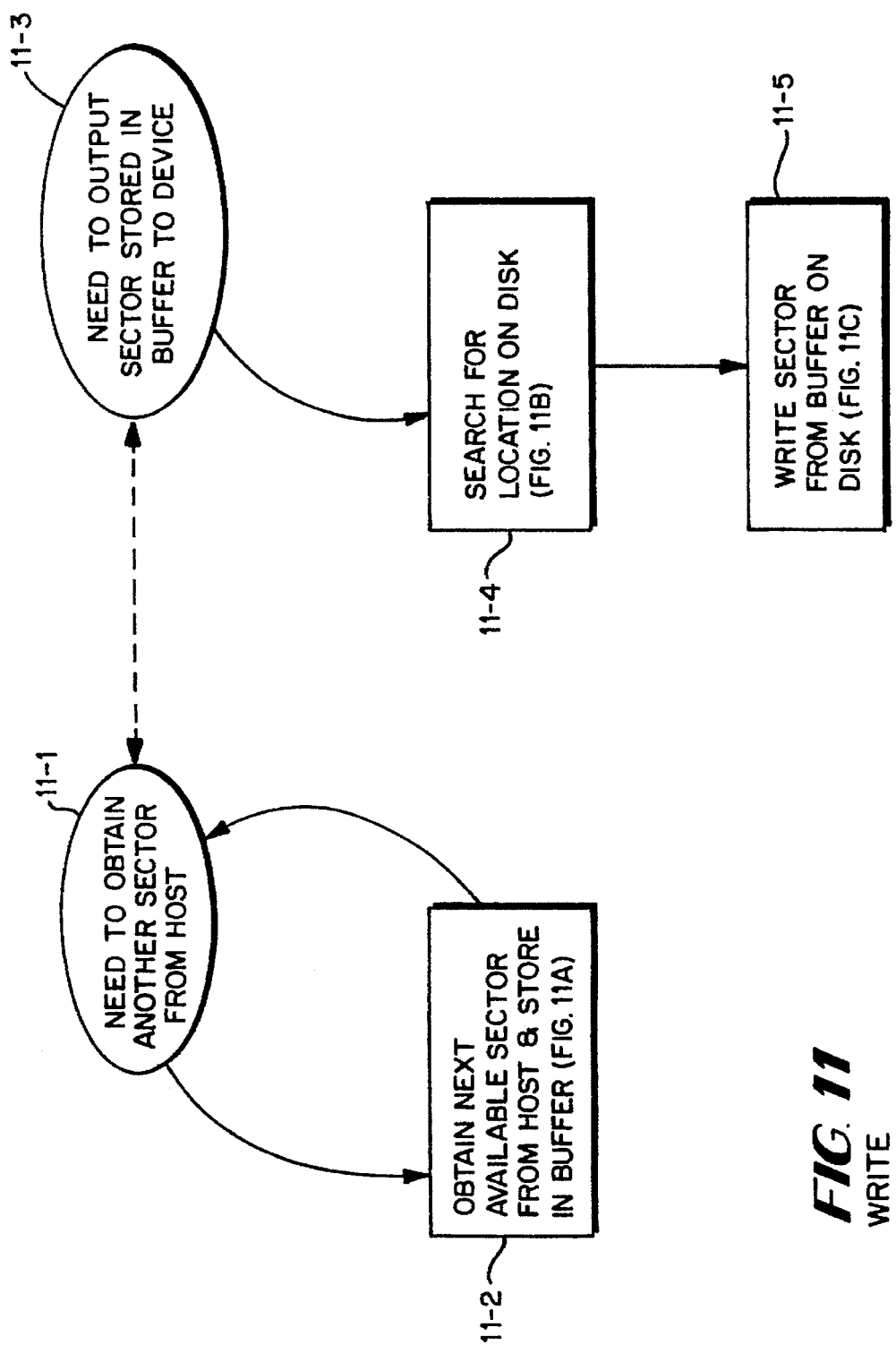
FIG. 11 is a state diagram showing general activities involved in an operation of writing sector(s) from a host to a storage medium handled by a utilization device, and shows relationships of FIG. 11A, 11B, and 11C.
Figure 11A:
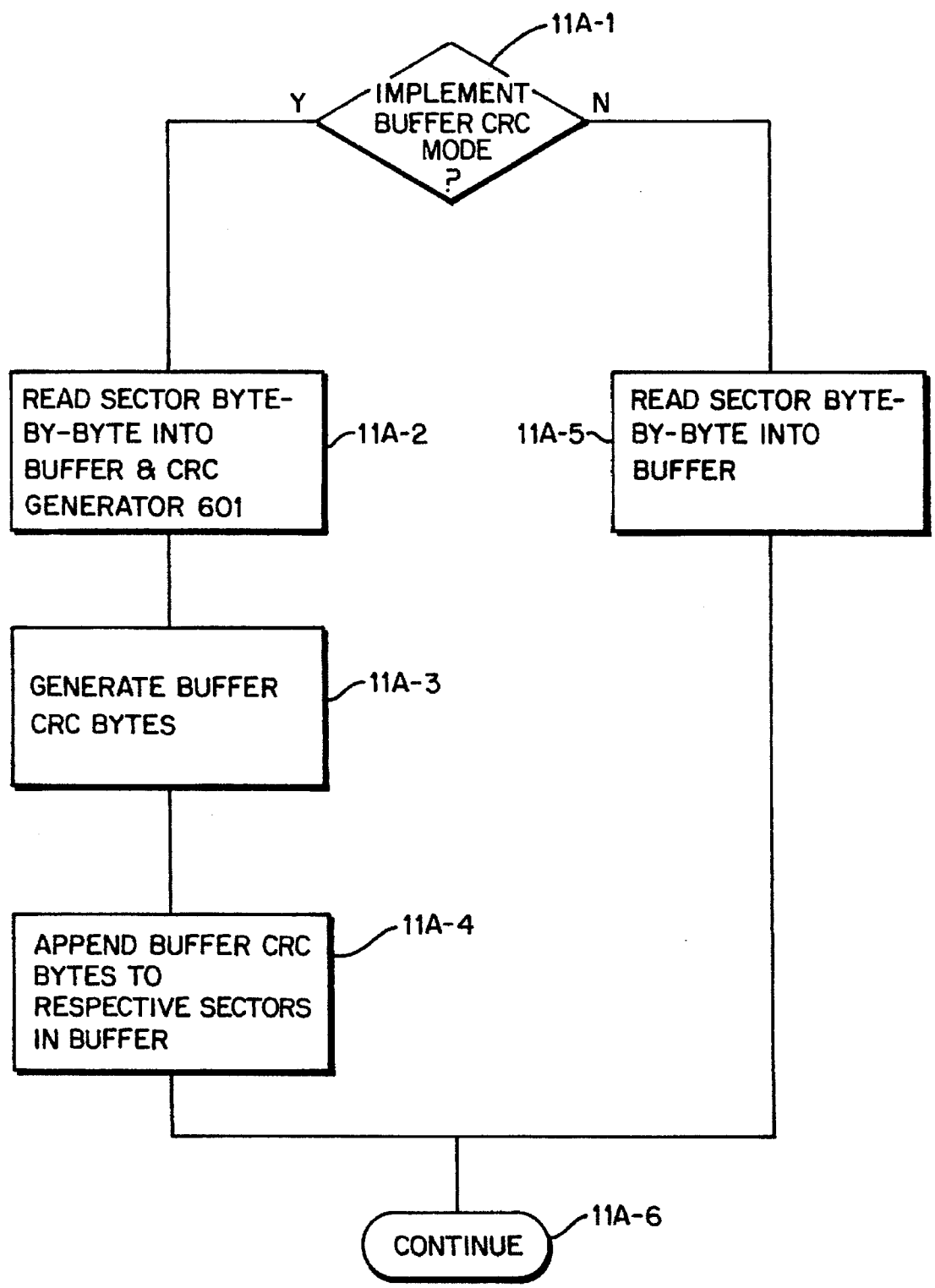
FIG. 11A is a flowchart showing steps involved in obtaining a sector from a host and storing the sector in a buffer.
Figure 11B:
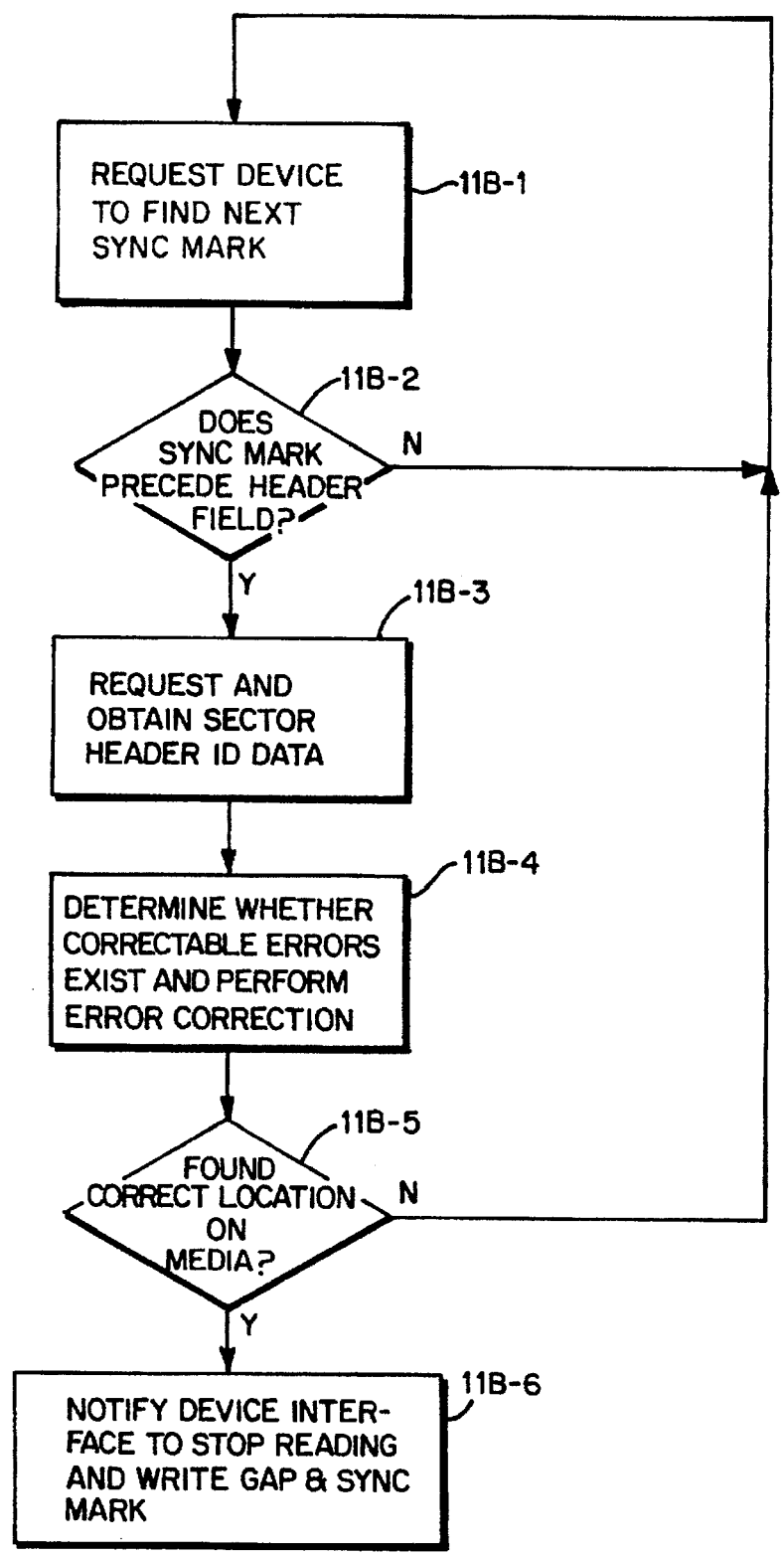
FIG. 11B is a flowchart showing steps involved in searching for a target write location on the storage medium.
Figure 11C:
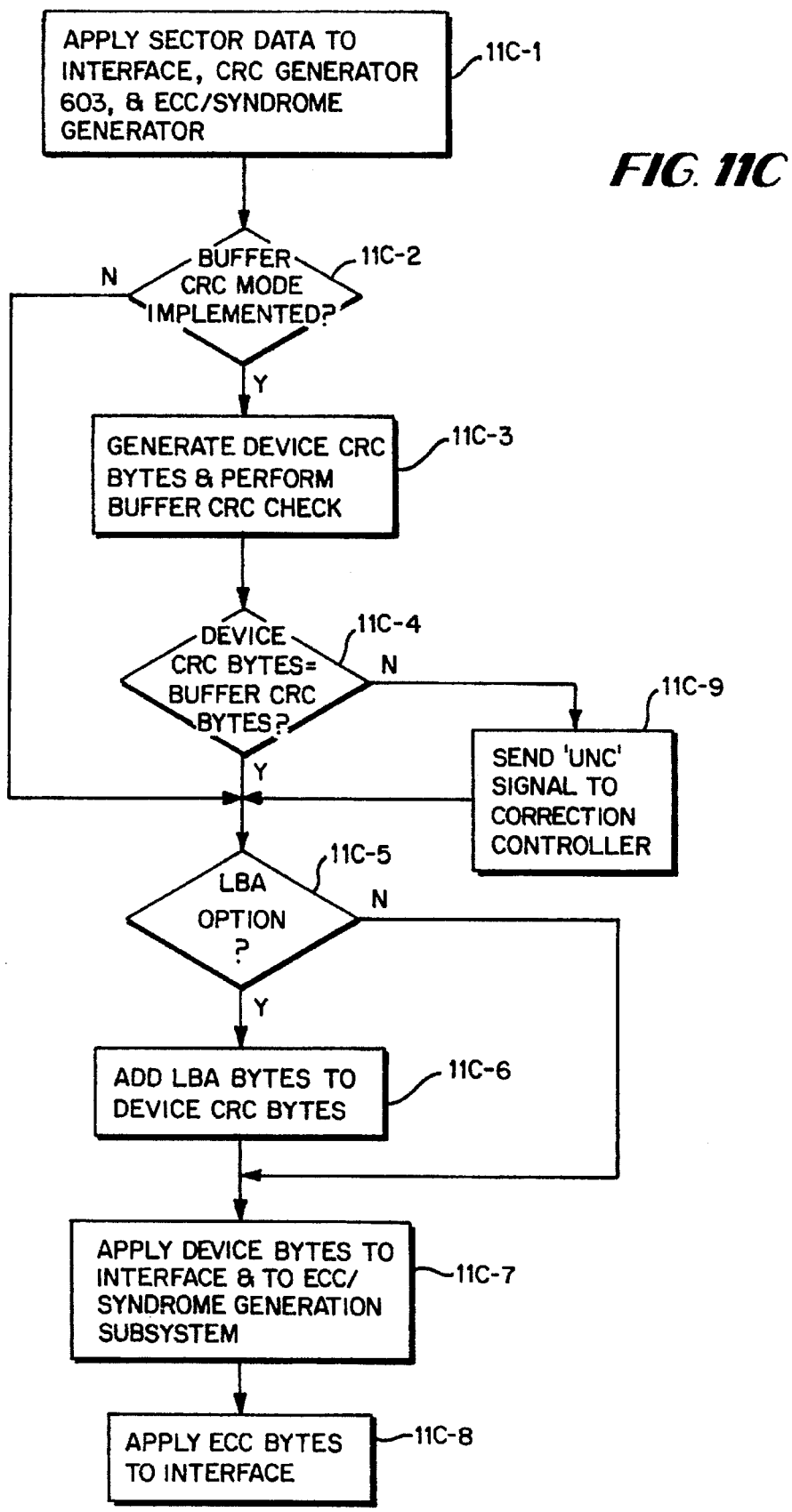
FIG. 11C is a flowchart showing steps involved in writing a sector on the storage medium.

FIG. 11 is a state diagram showing general activities involved in an operation of writing sector(s) from host 1010 to a storage medium handled by utilization device 1002, and further shows relationships of FIG. 11A, 11B, and 11C.

At state 11-1, correction controller 1020 checks to determine whether buffer 1100 can obtain another sector from host 1010. Such determination occurs, for example, when host 1010 indicates on host side control bus 1022 that another sector is available for transfer to device 1002. In response to an indication that another sector is available from host 1010, at state 11-2 the next available sector is obtained from host 1010 and applied to buffer 1100. More detailed steps involved in implementation of state 11-2 are described in connection with FIG. 11A.

In state 11-3, correction controller 1020 determines whether buffer 1100 should output a sector to device 1002 for storage on the media handled thereby. When the determination of state 11-3 is affirmative, states 11-4 and 11-5 are consecutively executed.

In state 11-4, correction controller 1020 directs device 1002 to search for the precise location on the media for storing the sector-to-be-outputted from buffer 1100. In this regard, sector ID data obtained from the media during the search operation may include errors, which errors are corrected by header (ID) subsystem 1060 on the fly. This and other more detailed steps involved in implementation of state 11-4 are described in connection with FIG. 11B. Then, after the appropriate location has been reached as a result of execution of state 11-4, at state 11-5 correction controller 1020 directs writing of the sector from buffer 1100 to device 1002 for recording on the media. More detailed steps involved in implementation of state 11-5 are described in connection with FIG. 11C.

OPERATION: WRITE FROM HOST: OBTAIN SECTOR

FIG. 11A illustrates steps involved in implementation of state 11-2 (e.g., obtaining a sector from host 1010 and storing the obtained sector in buffer 1100). Initially, it is determined at step 11A-1 whether the operator has specified implementation of the buffer CRC mode. In this regard, if register APPEND BUFFER CRC (see FIG. 1A) has been set in correction controller 1020, steps 11A-2, 11A-3 and 11A-4 of FIG. 11A will be executed. These steps allow generation of a programmable number of CRC bytes to be generated over data in the sector which will be obtained from the host. If register APPEND BUFFER CRC has not been set, step 11A-5 will instead be executed.

At step 11A-2, the sector available at host 1010 is transferred byte-by-byte both into buffer 1100 (via MUX 642 and system data bus 1080 in FIG. 2) and into CRC generator checker unit 601 (via MUX 643 in FIG. 2). If, for example, the sector being obtained from host 1010 is represented as sector $S_n$ in FIG. 8A, pointer $P_{S(n)}$ starts at the top of the memory location for the sector and is incremented byte-by-byte as each byte of the sector is transferred into buffer 1100.

As data bytes from the sector obtained from host 1010 are also clocked into CRC generator/checker 601, as shown in step 11A-3 CRC generator/checker 601 generates a programmable number of buffer CRC bytes for the sector. The number of buffer CRC bytes generated by CRC generator/checker 601 is determined by the value inputted into register # BUFFER CRC BYTES of correction controller 1020 (see FIG. 1A). As explained in U.S. patent application Ser. No. 08/325,717 entitled "CYCLIC REDUNDANCY CHECK METHOD AND APPARATUS" and U.S. patent application Ser. No. 08/147,865 entitled "DUAL PURPOSE CYCLIC REDUNDANCY CHECK" (both incorporated herein by reference), the data from the sector is divided into three input streams by segmenting circuit 710 (see FIG. 3), and a linear combination of the three streams is formed and used (by circuit 712) to generate the buffer CRC bytes. The buffer CRC bytes are outputted (on line 716 shown in FIG. 3) to MUX 642, so that MUX 642 applies the buffer CRC bytes to system data bus 1080 for receipt by buffer 1100.

At step 11A-4, the buffer CRC bytes are appended in buffer 1100 to the respective sector in buffer 1100. Appending of the buffer CRC bytes naturally occurs after all data bytes have been stored in buffer 1100, since all data bytes must first also be clocked through CRC generator/checker unit 601 in order to generate the buffer CRC bytes. The buffer CRC bytes for the sector are stored at an address in buffer 1100 with buffer manager 1120 associates with the respective sector, e.g, in addresses immediately following data bytes for the sector.

As indicated above, if register APPEND BUFFER CRC has not been set, step 11A-5 is executed. Step 11A-5 involves inputting the sector, byte-by-byte, into buffer 1100. The activity of step 11A-5 is understood with reference to previously-described step 11A-2, it being understood that step 11A-5 does not involve application of the sector to CRC generator/checker unit 601.

After completion of either step 11A-4 or step 11A-5, execution continues to await availability of another sector as indicated by step 11A-6.

OPERATION: WRITE FROM HOST: LOCATION SEARCH

FIG. 11B illustrates steps involved in implementation of state 11-4, e.g., searching for a location on media at which to record a sector ready for outputting from buffer 1100. At step 11B-1, correction controller 1020 requests device 1002 to find a next "sync" or synchronization mark on the media (see FIG. 10). After correction controller 1020 receives an indication that a next sync mark has been found, at step 11B-2 correction controller 1020 inquires whether the found sync mark precedes a header field (again see FIG. 10). If the result of step 11B-2 is negative, controller 1020 loops back to step 11B-1. If the result is positive, at step 11B-3 correction controller 1020 requests that sector ID data from the header field be obtained and moved (on device data bus 1092) into header (ID) subsystem 1060. In particular, at step 11B-3 the sector ID data from the header field is moved both into header ECC generator correction unit 1250 and header FIFO register 1252 (see FIG. 7).

At step 11B-4, header (ID) subsystem 1060, and particularly header ECC generator correction unit 1250, determines whether any errors exist in the sector ID obtained at step 11B-3. If correctable errors exist in the sector ID, at step 11B-4 header ECC generator correction unit 1250 performs correction of the sector ID. In the illustrated embodiment, the sector ID comprises eight bytes which are utilized by header ECC generator correction unit 1250 to generate syndromes and, when a correctable error is detected, an error pattern.

Should a sector ID error be noted at 11B-4, the error pattern generated by header ECC generator correction unit 1250 is applied on line 1256 to adder 1258 (see FIG. 7). Adder 1258 XORs the error pattern with the sector ID data originally obtained from media (which is stored in header FIFO register 1252) to perform correction, and then returns the corrected sector ID to register 1252 (via MUX 1260).

At step 11B-5 header (ID) subsystem 1060 determines whether the sector ID contained in header FIFO register 1252 (now corrected, if necessary, as described in step 11B-4) is the "TARGET ID" sought by correction controller 1020. The TARGET ID is the location at which the sector-to-be-outputted from buffer 1100 should be recorded. For the determination of step 11B-5, correction controller 1020 sends the value of TARGET ID to header comparator 1254 (see FIG. 7). Header comparator 1254 compares the value of TARGET ID with the value of the sector ID contained in header FIFO register 1252. If a match occurs, meaning that the correct location on media has been found, a signal TARGET FOUND is applied to correction controller 1020 (see also FIG. 1A).

If the TARGET ID is not found at step 11B-5, execution returns to step 11B-1 for searching for another sync mark, and ultimately for another sector ID. If the TARGET ID is found at step 11B-5, at step 11B-6 correction controller 1020 directs device interface 1004 to write a gap and a sync mark following the header, in preparation of recording a data field (the data field being the sector-ready-to-leave buffer 1100). In this regard, recall from FIG. 10 that, according to the media format, a gap and sync mark precede a data field.

OPERATION: WRITE FROM HOST: WRITE SECTOR

Steps involved in implementation of state 11-5 (e.g., recording a sector to disk) are described in connection with FIG. 11C. At step 11C-1, sector data from the sector-to-be-outputted from buffer 1100 is applied to device interface 1004, to CRC generation and checking unit 603, and to ECC/syndrome generation subsystem 1050. Assuming the sector-to-be-outputted from buffer 1100 is illustrated as sector $S_{n+k}$ in FIG. 8A, the pointer $P_{S(n+k)}$ is incremented as each byte of the sector data is read out of buffer 1100 and applied to system data bus 1080. As shown in FIG. 2, the bytes of sector data are transmitted from buffer 1100 to device interface 1004 via system data bus 1080, MUX 645, MUX 644, adder 1208, and MUX 1210. The bytes of sector data are transmitted from buffer 1100 to CRC generator/checker unit 603 via system data bus 1080 and MUX 645. The bytes of sector data are transmitted from buffer 1100 to ECC/syndrome generation subsystem 1050 via system data bus 1080, MUX 645, MUX 644, and adder 1208.

Concerning operation of CRC generator/checker unit 603, at step 11C-2 a determination is made whether the buffer CRC mode has been implemented. This mode has been described above with respect to analogous step 11A-1. If the buffer CRC mode has been implemented, steps 11C-3 and 11C-4 are executed, followed by step 11C-5. If the buffer CRC mode has not been implemented, execution jumps to step 11C-5.

At step 11C-3, CRC generator/checker unit 603 regenerates CRC bytes (the regenerated CRC bytes being known as device CRC bytes or secondary CRC bytes) and performs a check with respect to the buffer CRC bytes. In this regard, in connection with step 11C-3, CRC generator/checker unit 603 uses only the sector data obtained from buffer 1100 to regenerate its own device CRC bytes, in essentially the same manner as CRC generator/checker unit 601 generated the CRC buffer bytes as analogously described with respect to step 11A-3. After it has regenerated its own device CRC bytes, CRC generator/checker unit 603 receives the buffer CRC bytes appended to the sector data obtained from buffer 1100 and (at step 11C-3) compares those buffer CRC bytes to the regenerated device CRC bytes. The comparison is specifically performed by error checker 714 (see FIG. 3 and FIG. 3A) of CRC generator/checker unit 603.

If at step 11C-4 error checker 714 detects that the regenerated device CRC bytes do not agree with the buffer CRC bytes, then (at step) 11C-9 CRC generator/checker unit 603 sends an signal UNC to correction controller 1020 to advise that storage/retrieval from buffer 1100 introduced an error.

Assuming no buffer error, execution continues at step 11C-5 by checking to see whether the LBA option has been implemented. If the LBA option has been implemented, execution includes step 11C-6 followed by step 11C-7. If the LBA option has not been implemented, execution jumps directly to step 11C-7.

It will be recalled that the LBA option involves usage of the logical block address (LBA) in order to detect transfer of a wrong sector. If the LBA option has been implemented, at step 11C-6 the LBA bytes (DEVICE LBA) are added (XORed) at adder 1208 to the device CRC bytes outputted from CRC generator/checker unit 603.

As indicated above, step 11C-1 resulted in the application of the sector data bytes to interface device 1004. At step 11C-7, the device CRC bytes (optionally XORed with the LBA bytes at step 11C-6) are applied to interface device 1004 to follow the sector data bytes. In addition, at step 11C-7 these device CRC bytes are also applied to ECC/syndrome generation subsystem 1050.

Upon receipt of the sector data bytes and continuing with receipt of the device CRC bytes, ECC/syndrome generation subsystem 1050 has been generating ECC bytes for each codeword of the sector. The generation of the ECC bytes by ECC/syndrome generation subsystem 1050 is understood with reference to U.S. patent application Ser. No. 08/124, 936 of Zook and Glover, filed Sep. 21, 1993 and entitled "PROGRAMMABLE REDUNDANCY/SYNDDROME GENERATOR", which is incorporated herein by reference. As illustrated in FIG. 4A, ECC/syndrome generation subsystem 1050 conducts a three-interleaved ECC encoding operation. After the ECC bytes are generated, as shown at step 11C-8, the ECC bytes are applied to MUX 1210 to follow application of the device CRC bytes to device interface 1040.

Thus, that data field of a sector being written to the utilization device includes first the sector data (obtained from buffer 1100), followed by the device CRC bytes (obtained from CRC generator/checker unit 603 and optionally modified by LBA), followed by the ECC bytes (generated by ECC/syndrome generation subsystem 1050).

This data field would follow the gap and sync mark written by the device 1002 at step 115-6 (see also FIG. 10)

It should be understood that the foregoing activities, optionally modified as above noted, are conducted during normal operation for essentially each sector to be transferred from host 1010 to utilization device 1004. For example, if host 1010 were to request that user data sufficient to fill twenty sectors be transferred to media, twenty sectors would eventually be transferred into buffer 1100 and ultimately to utilization device 1004. All twenty sectors may or may not reside simultaneously in buffer 1100, depending upon such factors as size of the buffer and relative speed of the equipment (e.g, utilization device 1004).

OPERATION: READ FROM DEVICE: OVERVIEW

Figure 12:
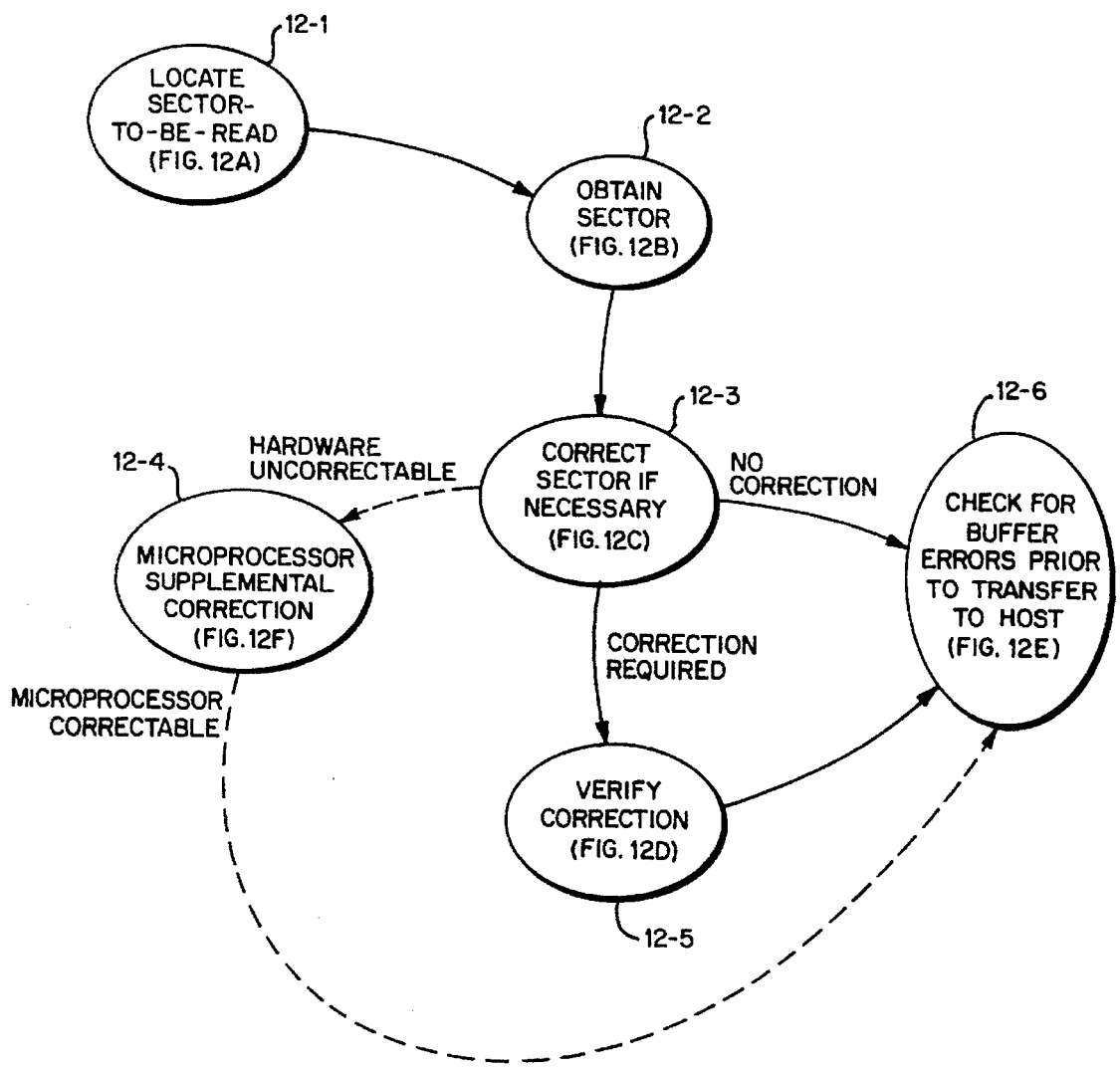
FIG. 12 is a state diagram showing general activities involved in an operation of reading sector(s) from a storage medium handled by a utilization device for transmission to a host, and shows relationships of FIG. 12A, 12B, 12C, 12D, 12E, and 12F.

FIG. 12 is a state diagram showing general activities involved in an operation of reading sector(s) from utilization device 1002 (e.g., from the storage medium handled by utilization device 1002) for transfer to host 1010, and further shows relationships of FIG. 12, FIG. 12B, FIG. 12C, FIG. 12D, FIG. 12E and FIG. 12F.

State 12-1 involves locating the particular sector to be read from utilization device 1002. Similar to the location operation performed with respect to FIG. 11B, state 12-1 requires checking (and, if necessary, correcting) of sector ID (header) data. More detailed steps involved in implementation of state 12-1 are described in connection with FIG. 12A.

State 12-2 involves obtaining from the media the sector-to-be-transferred and storing the sector in buffer 1100. More detailed steps involved in implementation of state 12-2 are described in connection with FIG. 12B. State 12-2 is ultimately followed by state 12-3, which involves checking each codeword of the sector to detect errors using correction subsystem 1070. If no correction is required, state 12-6 is assumed. If correction is required, during state 12-3 correction subsystem 1070 attempts to correct erroneous bytes of the sector. More detailed steps involved in implementation of state 12-3 are described in connection with FIG. 12C.

If the sector is correctable by correction subsystem 1070, state 12-5 is assumed for the purpose of using correction checker subsystem 1075 for verifying the correction implemented by correction subsystem 1070. More detailed steps involved in implementation of state 12-5 are described in connection with FIG. 12D.

Upon completion of state 12-5, state 12-6 is assumed. During state 12-6, CRC correction/checker unit 601 is utilized to check for any errors introduced by storage/retrieval operations concerning buffer 1100. More detailed steps involved in implementation of state 12-6 are described in connection with FIG. 12E.

Should correction subsystem 1070 determine during state 12-3 that a sector has an uncorrectable codeword, state 12-4 is optionally executed. In state 12-4, device microprocessor 1003 attempts to correct the sector using one or more programmed strategies. More detailed steps involved in implementation of state 12-4 are described in connection with FIG. 12F. Upon completion of optional state 12-4, state 12-6 is assumed.

OPERATION: READ FROM DEVICE: LOCATE SECTOR

Figure 12A:
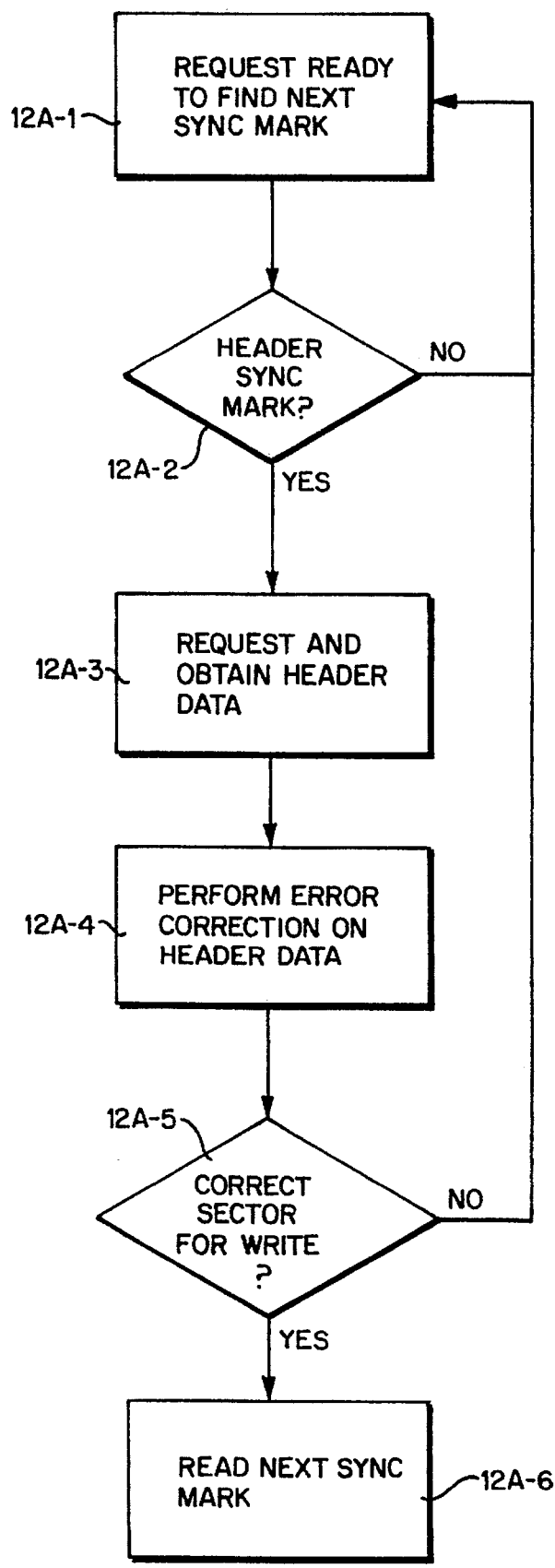
FIG. 12A is a flowchart showing steps involved in searching for a target read location on the storage medium handled by the utilization device.

FIG. 12A illustrates steps executed in implementation of state 12-1 (e.g., locating the particular sector to be read from utilization device 1002). At step 12A-1, correction controller 1020 request device interface 1004 to find the next sync mark on media. After correction controller 1020 receives an indication that a next sync mark has been found, at step 12A-2 correction controller 1020 inquires whether the found sync mark precedes a header field (again see FIG. 10). If the result of step 12A-2 is negative, controller 1020 loops back to step 12A-1. If the result is positive, at step 12A-3 correction controller 1020 requests that sector ID data from the header field be obtained and moved (on device data bus 1092) into header (ID) subsystem 1060. In particular, at step 12A-3 the sector ID data from the header field is moved both into header ECC generator correction unit 1250 and header FIFO register 1252 (see FIG. 7).

At step 12A-4, header (ID) subsystem 1060, and particularly header ECC generator correction unit 1250, determines whether any errors exist in the sector ID obtained at step 12A-3. If correctable errors exist in the sector ID, at step 12A-4 header ECC generator correction unit 1250 performs correction of the sector ID.

Should a sector ID error be noted at 12A-4, the error pattern generated by header ECC generator correction unit 1250 is applied on line 1256 to adder 1258 (see FIG. 7). Adder 1258 XORs the error pattern with the sector ID data originally obtained from media (which is stored in header FIFO register 1252) to perform correction, and then returns the corrected sector ID to register 1252 (via MUX 1260).

At step 12A-5 header (ID) subsystem 1060 determines whether the sector ID contained in header FIFO register 1252 (now corrected, if necessary, as described in step 12A-4) is the "TARGET ID" sought by correction controller 1020. The TARGET ID is the location at which the sector-to-be-outputted from buffer 1100 should be recorded. For the determination of step 11B-5, correction controller 1020 sends the value of TARGET ID to header comparator 1254 (see FIG. 7). Header comparator 1254 compares the value of TARGET ID with the value of the sector ID contained in header FIFO register 1252. If a match occurs, meaning that the correct location on media has been found, a signal TARGET FOUND is applied to correction controller 1020 (see also FIG. 1A).

If the TARGET ID is not found at step 12A-5, execution returns to step 12A-1 for searching for another sync mark, and ultimately for another sector ID. If the TARGET ID is found at step 12A-5, at step 12A-6 correction controller 1020 requests device interface 1004 to read to the next sync mark on the media. In this regard, it will be recalled from the previous discussion of FIG. 10 that data fields follow a sync mark. Now that the header for the sector-to-be-read has been found (at step 12A-5), correction controller 1020 knows that the user data required by host 1010 follows the next sync mark.

OPERATION: READ FROM DEVICE: OBTAIN SECTOR

Figure 12B:
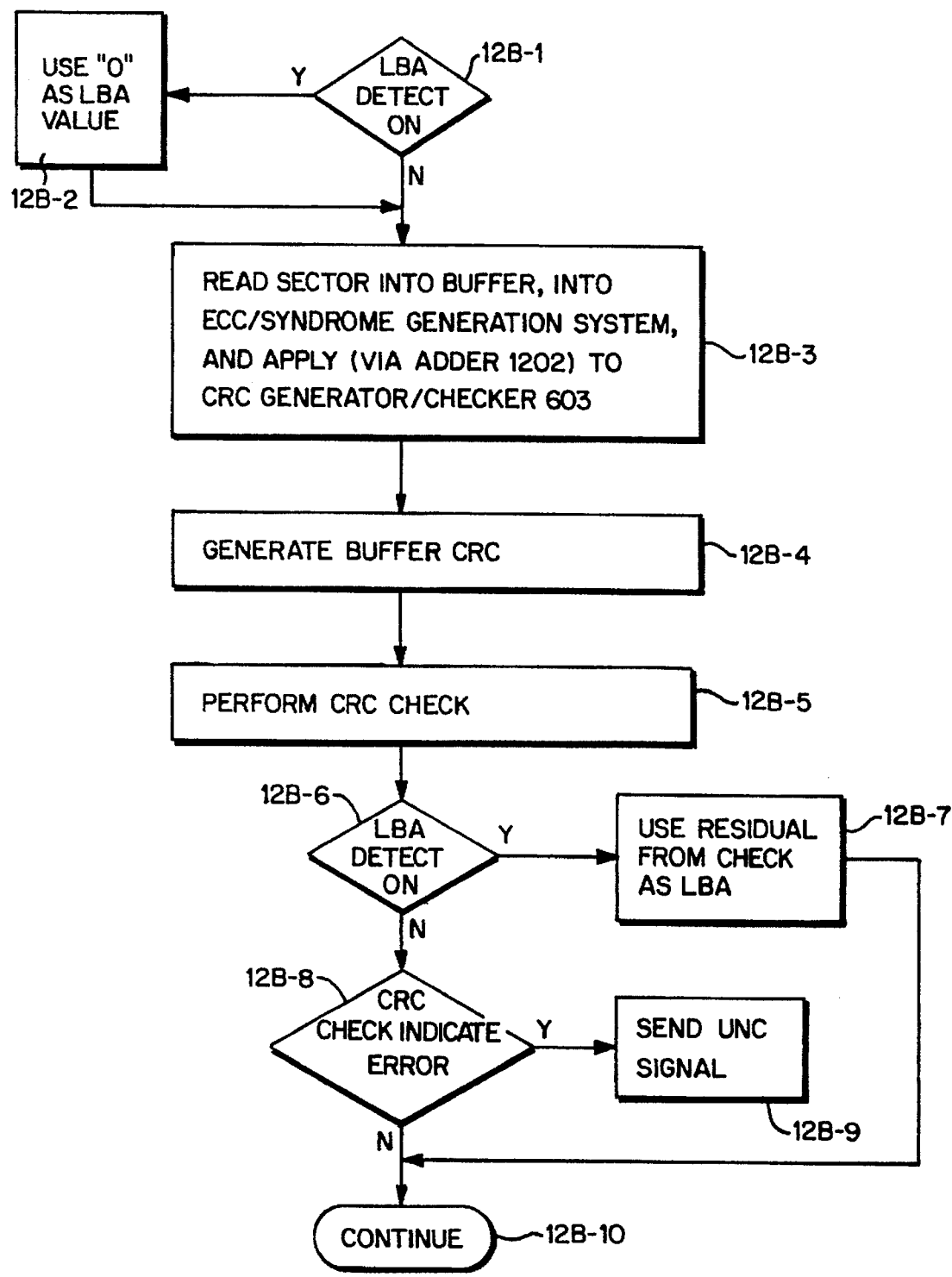
FIG. 12B is a flowchart showing steps involved in obtaining a sector from the storage medium.
Figure 12C:
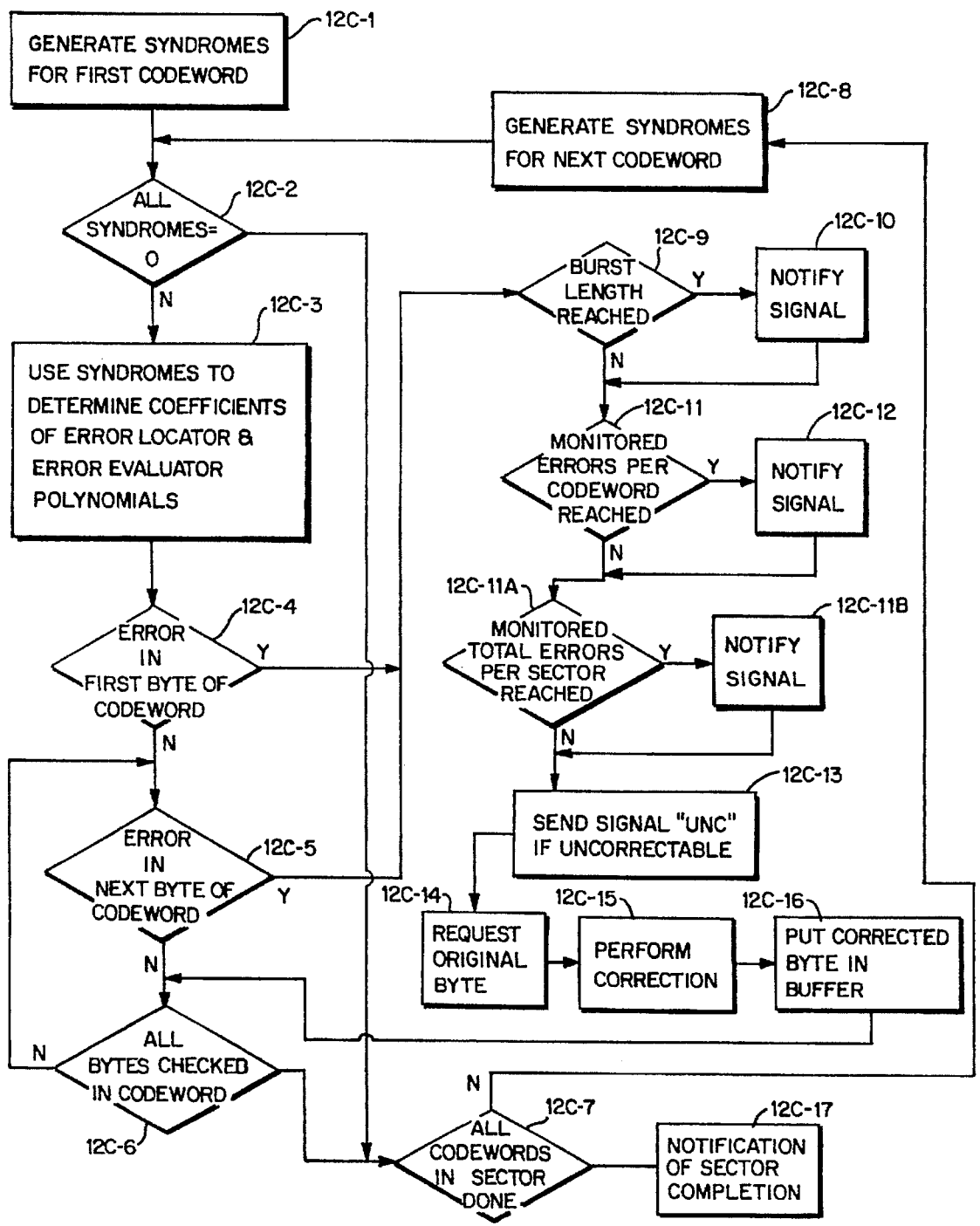
FIG. 12C is a flowchart showing steps involved in correcting a sector from the storage medium.

As a result of performance of state 12-1, and particularly the last step 12A-6 thereof, utilization device is positioned to read the user data for the sought sector. FIG. 12C illustrates steps executed in implementation of state 12-2 (e.g., obtaining a sector from device 1002).

Initially, at step 12B-1, correction controller 1020 determines whether a DETECT LBA mode has been implemented. The DETECT LBA mode is implemented when a user or operator and/or correction controller 1020 does not know, but would like to know, specific values utilized during the LBA mode (e.g., logical block address values). DETECT LBA mode is implemented by setting register DETECT LBA in correction controller 1020 (see FIG. 1A).

If the DETECT LBA mode has been implemented, as a result of the determination at step 12B-1, step 12B-2 is executed prior to executing step 12B-3. Step 12B-2 involves requesting LBA subsystem 1040 to use zero as the LBA value which is applied when sector CRC values are being transmitted through adders 1202 and 1208.

At step 12B-3, correction controller 1020 directs device interface 1004 to apply the user data from the sector to device data bus 1092. Upon such application, the user data of the sector is transmitted (via system data bus 1080) into buffer 1100 (under control of buffer manager 1120). In this regard, assuming sector $S_m$ as illustrated in FIG. 12B is being acquired from utilization device 1004, buffer manager 1120 uses incrementing pointer $P_{S(m)}$ for clocking bytes of the sector into buffer 1100.

It will also be noted that the sector user data obtained from utilization device is simultaneously applied (via MUX 645 and adder 1202) to CRC generator/checker unit 603 and (via MUX 645, MUX 644, and adder 1208) to ECC/syndrome generation subsystem 1050. If the DETECT LBA option is implemented, or if the basic LBA OPTION is not implemented, during application of CRC bytes to adders 1202 and 1208, zero signals will be applied to adders 1202 and 1208 from LBA subsystem 1040 (see step 12B-2 above). If the LBA signal applied from LBA subsystem 1040 is non-zero, the LBA signals applied from LBA subsystem 1040 to adders 1202 and 1208 when the CRC bytes are applied serve to remove the LBA values from the CRC values.

At step 12B-4, CRC generator/checker unit 603 uses the incoming sector data to generate buffer CRC bytes. The manner of such regeneration is understood with reference to previous discussions of CRC regeneration. Then, at step 12B-5, error checker 714 of CRC generator/checker unit 603 compares the regenerated buffer CRC bytes with the incoming, sector-obtained CRC bytes (with any known LBA removed).

After the CRC check of step 12B-5, at step 12B-6 correction controller 1020 again determines whether the LBA DETECT mode is implemented (in like manner as step 12B-1 above). If the LBA DETECT mode is implemented, and if the check of step 12B-5 resulted in an error pattern, at step 12B-7 such error pattern developed by checker 714 of CRC generator/checker unit 603 is now presumed to be the previously unknown LBA value. If the LBA DETECT mode is not implemented, a determination is made at step 12B-8 whether the check of step 12B-5 resulted in an error. If so, at step 12B-9 an uncorrectable signal (UNC) is generated on line 718 for application to correction controller 1020. Otherwise, execution continues (as indicated by step 12B-10) with the sector checking and (if necessary) correction.

OPERATION: READ FROM DEVICE: CORRECT SECTOR

FIG. 12C illustrates steps executed in preferred implementation of state 12-3 (e.g., checking each codeword of the sector to detect errors using correction subsystem 1070). It should be understood that various correction techniques may be employed without departing from the scope of the present invention. For instance, while normally syndromes are used to decode error values and locations during a read operation, alternatively, remainder derived from dividing the codeword by generator polynomial, can be employed to decode the same. The term error signature will thus denote the use of either syndromes or remainders for decoding purposes in a read operation. At step 12C-1, ECC/syndrome generation subsystem 1050 generates syndromes for the first codeword of the sector. The syndromes are applied on line 1220 to correction subsystem 1070. The manner of syndrome generation by ECC/syndrome generation subsystem 1050 is understood from U.S. patent application Ser. No. 08/124,936 of Zook and Glover, filed Sep. 21, 1993 and entitled "PROGRAMMABLE REDUNDANCY/SYNDROME GENERATOR", which is incorporated herein by reference.

At step 12C-2 it is determined whether all syndromes generated for the codeword are zero. If one or more of the syndromes is non-zero, steps 12C-3 through 12C-6 are executed prior to execution of step 12C-7. If all syndromes are zero, execution jumps to step 12C-7.

At step 12C-3, correction subsystem 1070, and particularly decoder circuit 199 (see FIG. 5) uses the syndromes applied on line 1220 determine coefficients of an error locator polynomial $\sigma$ and thereafter generates coefficients of an error evaluator polynomial $\omega$ for the codeword. Also at step 12C-3, root search and error/erasure magnitude generator 196 determines the error pattern for the codeword.

At step 12C-4 it is determined whether the error locators point to the first byte of the codeword as being erroneous. If an error does not detected in the first byte of the codeword, a check is made at step 12C-5 to determine if an error exists for the next byte of the codeword. Checking for erroneous bytes continues through the codeword (indicated by looping back to step 12C-5) until it is determined (at step 12C-6) that all bytes of the codeword have been checked.

When it is determined at step 12C-6 that all bytes of the codeword have been checked for error, a determination is made (at step 12C-7) whether other codewords of the sector remain for checking. If other codewords remain, execution jumps to step 12C-8 for generation of syndromes for the next codeword. After the syndromes for the next codeword are generated at step 12C-8, execution returns to step 12C-2 for checking whether the syndromes are zero.

If it is determined at either step 12C-4 or step 12C-5 that an error exists in a byte of the codeword, step 12C-9 is next executed. At step 12C-9, it is determined if the number of consecutive bytes in the codeword having an error has reached the number inputted to decoder circuit 199 by the programmable signal BURST LENGTH. The value of signal BURST LENGTH is programmed by setting the value MONITOR BURST LENGTH in mode select registers 1029 (see FIG. 1A). If the BURST LENGTH value is reached, at step 12C-10 decoder circuit 199 issues a notification signal BURST LENGTH DETECT to correction controller 1020. The value of signal BURST LENGTH can thus be programmed on the fly, as may occur when, for example, an operator is informed that the originally-programmed BURST LENGTH value has been reached, and the operator desires to raise the BURST LENGTH value for continuing operation.

After execution of step 12C-9 or step 12C-10, step 12C-11 is executed. At step 12C-11, root search and error/erasure magnitude generator 196 determines whether the number of erroneous bytes thus far encountered in the codeword exceeds a threshold value CODEWORD ERROR NUMBER input from correction controller 1020. The value of CODEWORD ERROR NUMBER is also programmable on the fly in accordance with a corresponding setting of mode select register MONITOR CODEWORD ERROR NUMBER of correction controller 1020 (see FIG. 1A). The value of CODEWORD ERROR NUMBER is typically less than the number of errors that would render a codeword uncorrectable. If the number of (not necessarily consecutive) bytes in the codeword requiring correction reaches the value CODEWORD ERROR NUMBER, generator 196 issues a signal DETECT # CODEWORD ERRORS to correction controller 1020 (step 12C-12). In a similar manner, the total number of errors in a sector is monitored by 12C-11A and if the same exceeds the value in register MONITOR TOTAL ERROR COUNT, status is accordingly reported by 12C-11B.

After execution of step 12C-11 or step 12C-12, step 12C-13 is executed. At step 12C-13, root search and error/erasure magnitude generator 196 sends a signal UNC (i.e., uncorrectable) if the codeword is uncorrectable.

Assuming that the codeword is correctable, at step 12C-14, it is requested that the original (erroneous) byte in buffer 1100 be sent (on line 1240) to register 195 (see FIG. 5). Then, at step 12C-15, adder 202 performs the correction by XORing the error pattern (applied on line 1236 from error/erasure magnitude generator 196) with the original byte (in register 195), with the result being returned (step 12C-16) on line 1242 and stored as the corrected byte in buffer 1100.

After byte correction is performed at step 12C-6, step 12C-6 is next executed for determining whether other bytes remain for checking in the codeword.

In connection with the correction of bytes in a sector, in the illustrated embodiment bytes of the sector are checked in reverse order. Accordingly, FIG. 8B shows correction byte pointer $P_{S(m+c)}$ starting at the last byte of the sector, and (unlike other buffer pointers) being decremented upon examination of the "next" byte.

After all codewords in a sector have been checked and erroneous codewords corrected, at step 12C-17 correction controller 1020 is notified of completion of the sector.

In FIG. 1A, erasure pointers 1094, are generated in real time by detector unit 1004A and RLL 1004B and output by device interface 1004 while data is continuously being received by device interface 1004.

OPERATION: READ FROM DEVICE: CHECK CORRECTION

Figure 12D:
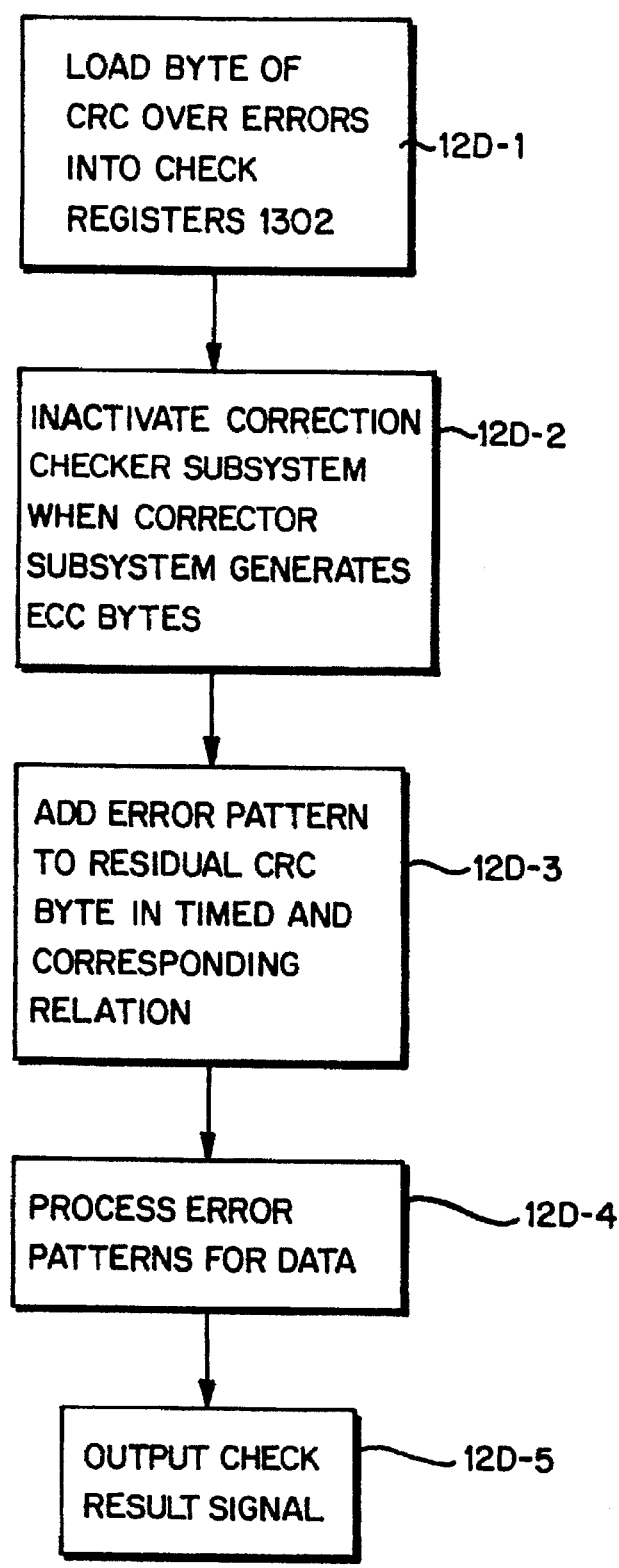
FIG. 12D is a flowchart showing steps involved in checking correction of a sector obtained from the storage medium.

FIG. 12D illustrates steps executed in connection with state 12-5 (e.g., steps executed by correction checker subsystem 1075 for verifying the correction implemented by correction subsystem 1070). At step 12D-1, the CRC check remainder bytes are loaded into resisters 1302 (see FIG. 6) on line 1244 from CRC generator/checker unit 603. As explained above with reference to FIG. 6, the first byte of the CRC check remainder bytes is loaded into register $1302_0$; the second byte of CRC check remainder bytes is loaded into register $1302_1$; and so forth. Should there be more stages in correction checker subsystem 1075 than CRC bytes supplied by CRC generator/checker unit 603, the higher staged (i.e., higher subscripted) registers are filled with zeroes.

It will be recalled that correction subsystem 1070 checks and corrects in a byte order which is the reverse of the order in which bytes are stored in buffer 1100 (see FIG. 8B). Accordingly, during a correction process, correction subsystem 1070 will first process ECC bytes, followed by CRC bytes, followed by data bytes. As the sector is clocked through, when an error is detected for a particular byte an error pattern for that byte is applied on line 1236 (see FIG. 5 and FIG. 6).

For each clocking of correction subsystem 1070 (i.e., clocking of ECC bytes, CRC bytes, and data bytes), correction checker subsystem 1075 is also clocked. However, as explained below in more detail with reference to steps 12D-2 and 12D-3, in the illustrated embodiment data (i.e., a compensated error pattern) is clocked into registers 1302 of correction checker subsystem only when an error pattern is produced for the corresponding byte of the clock.

Step 12D-2 shows that correction checker subsystem 1075 is rendered inactive while correction subsystem 1070 clocks through ECC. However, following the processing of ECC bytes by correction subsystem 1070, correction subsystem 1070 may output error patterns for CRC bytes, those CRC byte error patterns being generated and applied on line 1236 in timed relation with the clocking through of the sector by correction subsystem 1070. While the number of potential CRC error patterns generated by correction subsystem 1070 corresponds to the number of CRC bytes stored in registers 1302 of correction checker subsystem 1075, it is likely that error patterns will be generated for less than all of these CRC bytes. When an error pattern is generated for a CRC byte which corresponds to the CRC check remainder byte stored in a register $1302_x$ (x being used as a subscript to represent any one of the stages of FIG. 6), correction controller 1020 turns on a pointer control signal CRCPTRX (X=0 to 5). For example, if an error pattern is generated corresponding to the CRC check remainder byte 0, pointer CRCPTR0 is turned on. Accordingly, step 12D-3 of FIG. 12D shows that the error pattern (if any) is added to register 1302 in timed relation to the outputting of the compensated error pattern.

In connection with the clocking of error patterns for CRC bytes, the error pattern produced by correction subsystem 1070 and applied on line 1236 is not multiplied by compensation circuit 1316 (i.e., the branch of circuit 1316 not having a multiplier is utilized).

After all CRC bytes have been handled in the manner aforedescribed with respect to step 12D-3, correction checker subsystem 1075 is next clocked in time relation with the clocked processing of data bytes by correction subsystem 1070. Error patterns generated for data bytes are applied on line 1236 to compensation circuit 1316. If the data byte for which the error pattern is produced was multiplied by multiplier $M_1$ of segmentation circuit 710 (see FIG. 3A), then the error pattern for that byte will be multiplied by multiplier $M_1$ of compensation circuit 1316. Similarly, if the data byte for which the error pattern is produced was multiplied by multiplier $M_2$ of segmentation circuit 710, then the error pattern for that byte will be multiplied by multiplier $M_2$ of compensation circuit 1316. Thus, for error patterns concerning data bytes, compensation circuit 1316 outputs a compensated error pattern on line 1320.

Step 12D-4 reflects the processing of error patterns for data, including the above-mentioned compensation for segmentation and also for feedback multiplication implemented by feedback multipliers 1308. In the particularly illustrated embodiment, during the data byte portion of processing, feedback multiplication using multipliers 1308 occurs only every third clock (again in view of the particular structure and operation of the segmentation circuits 710 included in the CRC generation/checking system 1030). Feedback multiplication occurs only during processing of error patterns for data bytes, and then only for every third clock.

After all error patterns for CRC and data bytes have been processed in the manner above described with respect to steps 12-3 and 12D-4, the values of registers 1302 should all be zero if correction subsystem 1070 accurately performed correction. At step 12D-5, OR gate 1314 outputs a check result signal. If the check result signal output by gate 1314 is non-zero, the check result signal is treated as an uncorrectable error signal.

It should be understood that the particular values of the feedback multipliers 1308, as well as the employment of a compensation circuit 1316 and the every third clock feedback multiplication, results from the particular structure and operation of other aspects of error correction system 1000, particularly CRC correction/checker subsystem 1030. Accordingly, the correction checking of the present invention should not be so limited in general application.

Moreover, it should be understood that correction checker subsystem 1075 can be operated in alternative ways. For example, if correction subsystem 1070 is configured to output a byte for every clock (e.g., non-zero error patterns), then clocking into register 1302 of correction checker subsystem 1075 can likewise occur for every clock.

OPERATION: READ FROM DEVICE: CRC CHECK

Figure 12E:
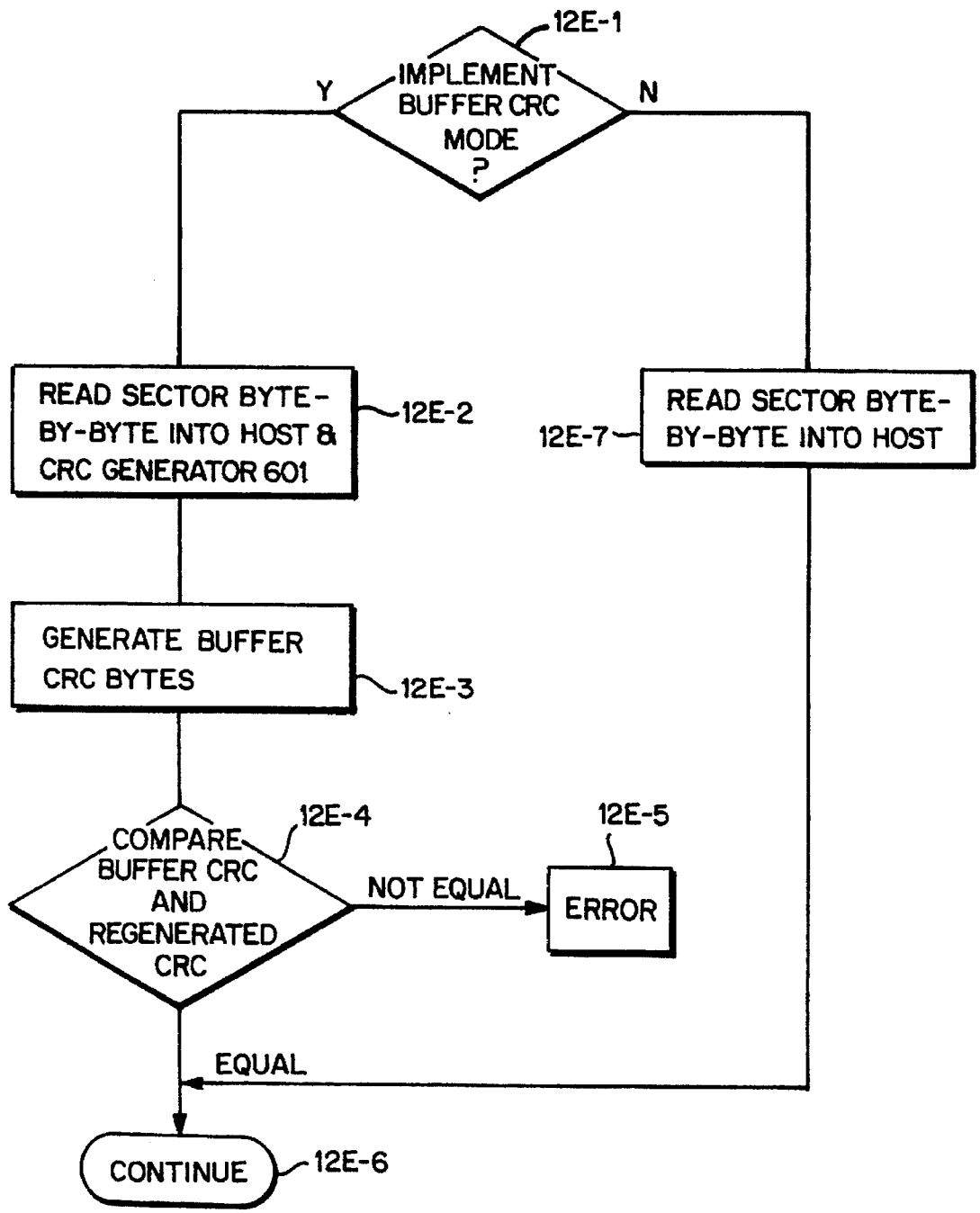
FIG. 12E is a flowchart showing steps involved in checking a sector obtained from buffer during transfer to a host.

FIG. 12E illustrates steps executed in connection with state 12-6 (e.g., using CRC correction/checker unit 601 to check for any errors introduced by storage/retrieval operations concerning buffer 1100). At step 12E-1, a check is made to determine whether the buffer CRC option is in effect. If the buffer CRC option is in effect, steps 12E-2 through 12E-4 are executed. At step 12E-2 the sector-to-be-transmitted to host 1010 is read out of buffer 1100 and transmitted both to host 1010 and to CRC generator/checker unit 601. At step 12E-3, CRC generator/checker unit 601 regenerates CRC bytes for the sector data. At step 12E-4, checker unit 714 compares the CRC bytes which it regenerates with the buffer CRC bytes earlier generated by CRC generator/checker unit 603. If the two sets of CRC bytes are not identical, an error message is generated (step 12E-5). If the two sets of CRC are equal, correction controller 1020 awaits availability of a next sector to be transferred (step 12E-6).

If the buffer CRC option is not in effect, at step 12E-7 the sector-to-be-transmitted to host 1010 without being transmitted to CRC generator/checker unit 601. Thereafter, correction controller 1020 awaits availability of a next sector to be transferred (step 12E-6).

OPERATION: READ FROM DEVICE: SUPPLEMENTAL CORRECTION

Figure 12F:
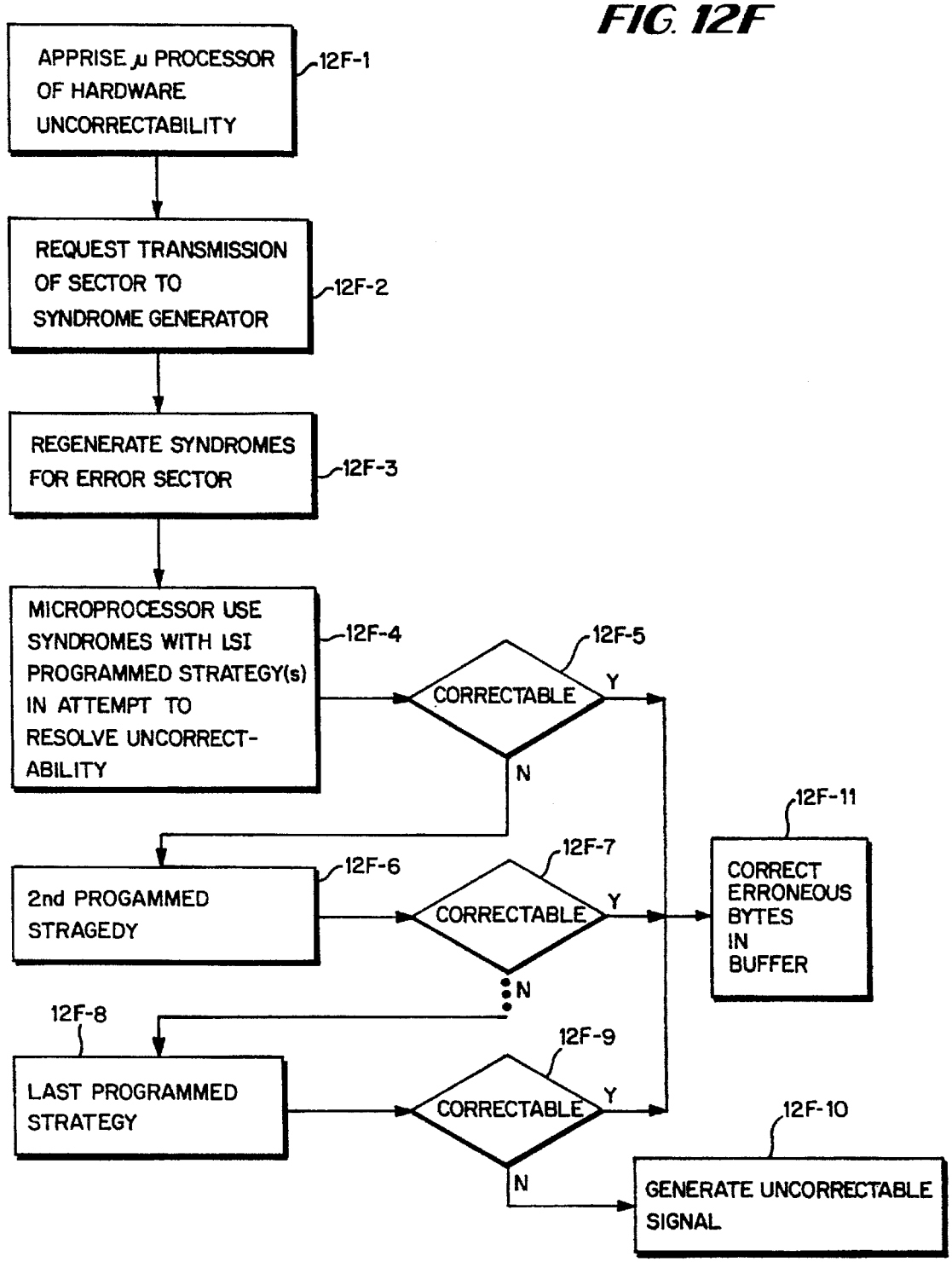
FIG. 12F is a flowchart showing steps involved in supplemental correction undertaken by a device microprocessor.

FIG. 12F illustrates general steps executed in connection with 12-4 (e.g., permitting microprocessor 1003 to attempt to correct the sector using one or more programmed strategies). This supplemental correction attempt is optionally undertaken by microprocessor 1003 when requested by the appropriate setting of register μP SUPPLEMENTAL CORRECTION OPTION in correction controller 1020 (see FIG. 1A).

Supplemental correction is initiated at step 12F-1 when correction controller 1020 advises device microprocessor 1003. Such advisement occurs after correction controller 1020 has received an uncorrectable signal (e.g., from correction subsystem 1070). At this point, hardware-implemented on-the-fly error correction has been unsuccessful in correcting all multiple randomly-located error symbols, consequently, further correction is resumed by microprocessor-executed software or firmware off line.

When device microprocessor 1003 is alerted that supplemental correction is to be attempted, at step 12F-2 device microprocessor 1003 requests that the sector which includes the uncorrectable error again be transmitted to ECC/syndrome generation subsystem 1050. The sector is transmitted to ECC/syndrome generation subsystem 1050 via MUX 645, MUX 644, and adder 1208 in the manner aforedescribed. At step 12F-3, ECC/syndrome generation subsystem 1050 generates syndromes for each of the codewords of the sector. The syndromes must be re-generated at step 12F-3, because the previously-generated syndromes for the sector are no longer available at this point in time. In connection with step 12F-3, it is understood from FIG. 4 that the syndromes for a codeword of the sector are applied on syndrome bus 1052 to device microprocessor 1003.

Figure 9:
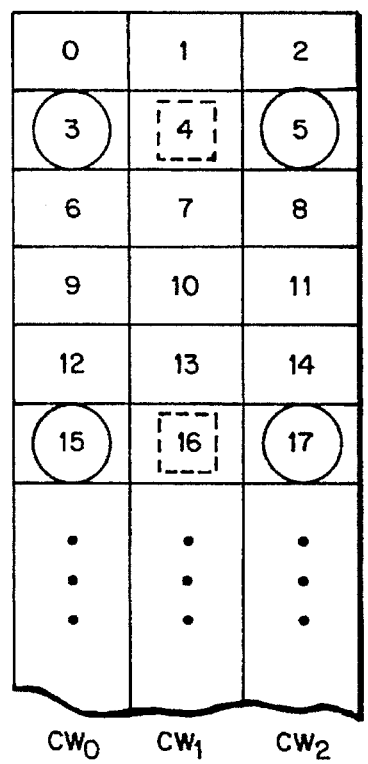
FIG. 9 is a diagrammatic view of an interleaved sector which undergoes an illustrative mode of attempted supplemental correction by a device microprocessor.

Device microprocessor 1003 uses the syndromes in connection with one or more programmed strategies in an attempt to resolve uncorrectability of a codeword in the sector. An example of a first such strategy is illustrated in FIG. 9. FIG. 9 represents three adjacent interleaved codewords of a sector (codewords $CW_0$, $CW_1$, and $CW_2$), each codeword being viewed as a column in FIG. 9 and the bytes of the sector being numerically labeled. Device microprocessor 1003 determines that error pointers exist for bytes 0, 5, 15 and 17; that codewords $CW_0$ and $CW_2$ are correctable; but that codeword $CW_1$ is uncorrectable. The bytes pointed to by pointers have byte numbers encircled in FIG. 9. This determination of error pointers may result by independent software correction techniques executed by device microprocessor 1003 using the syndromes, or alternatively the pointers previously generated/obtained by error correction system 1000 for the codewords may be communicated to device microprocessor 1003. In either case, device microprocessor 1003 is now ready to implement a supplemental correction strategy.

Step 12F-4 shows device microprocessor attempting a first example of a supplemental correction strategy. In the first example supplemental correction strategy in which it is assumed that errors occur in bursts which affect adjacent interleaves, the pointer positions are analyzed as device microprocessor 1003 endeavors to discern any pattern for pointer positions, as would occur in a burst, for example. Thus, in connection with the first illustrated supplemental correction strategy, device microprocessor 1003 notes that pointers are set for bytes 3 and 5 and also for bytes 15 and 17. In attempting to discern a pattern for the pointers, device microprocessor 1003 presumes that pointers also be set for bytes 4 and 16 (byte numbers appearing in phantom blocks in FIG. 9), since appears it that there may be a linear pattern formed by bytes 3, 4, and 5 near the top of FIG. 9 and a linear pattern formed by bytes 15, 16, and 17 near the bottom of FIG. 9.

With pointers now tentatively set for bytes 4 and 16 in connection with the first supplemental correction strategy, device microprocessor 1003 executes a standard correction routine of programmable instructions to determine if the setting of pointers for bytes 4 and 16 results in correctability for codeword $CW_1$. If the first supplemental strategy results does not result in correction of the previously uncorrectable codeword(s) as determined at step 12F-5, a second supplemental strategy is implemented (step 12F-6).

An example of a second supplemental correction strategy executed at step 12F-6 involves repeated re-reading of the sector from media in order to discern variations in byte values among the plurality of reads. According to the second strategy, device microprocessor 1003 requests that the entire uncorrectable sector be copied in a first location in a memory which is local to device microprocessor 1003. Then device microprocessor 1003 requests correction controller 1020 request again the same sector from media. The re-requested sector is responsively transmitted into buffer 1100 in the same manner as aforedescribed in connection with read from device operations. After transmission of the sector to buffer 1100, device microprocessor requests that this second transmission of the sector be copied into its local memory, this time into a second location in local memory. These steps of requesting that the sector be again read from media, moved into buffer 1100, and then moved into local memory may be repeated a predetermined or programmable number of times. In connection with the second supplemental strategy, device microprocessor 1003 examines corresponding byte locations of the various copies of the sector in its local memory to determine variances in stored values. Any noted variances are presumed to result from error, so that device microprocessor 1003 sets tentative error pointers for the variant bytes.

Implementation of the second supplemental strategy is followed by attempted correction using conventional programmed correction operations. If correction is not successful as a result of the second supplemental strategy (as determined at step 12F-7), a further supplemental correction strategy is implemented until a last correction strategy (see step 12F-8) is executed. If the last correction strategy is not successful (as determined at step 12F-9), device microprocessor 1003 generates an uncorrectable signal (step 12F-10).

Should any supplemental correction strategy result in correction (as determined at steps 12F-5, 12F-7, or 12F-9, for example), at step 12F-11 device microprocessor 1003 implements the correction by directing that the erroneous bytes in buffer 1100 be replaced with the corrected bytes as deduced by device microprocessor 1003 after using the supplemental correction strategy.

Other advantages of error correction system 1000 and the invention described herein are set forth in CL-SH385 I PCMCIA/ATA Disk Controller Data Book, incorporated by reference.

While the invention has been particularly shown and described with reference to the preferred embodiments thereof, it will be understood by those skilled in the art that various alterations in form and detail may be made therein without departing from the spirit and scope of the invention.

The embodiments of the invention in which an exclusive property or privilege is claimed are defined as follows:

1. An error correction system for rotating magnetic media, the error correction system comprising:
   a CRC generator/checker which generates CRC check remainder bytes by (1) using input data from a read sector to obtain regenerated CRC bytes for the read sector, and (2) adding the regenerated CRC bytes to incoming CRC bytes of the read sector;
   a correction unit which generates error patterns for correcting errors in the read sector;
   a correction checker unit, responsive to the CRC check remainder bytes and the error patterns, for confirming that the error patterns accurately correct the errors in the read sector, the correction checker unit including:
      a predetermined number of registers into which are loaded a corresponding predetermined number of the CRC check remainder bytes;
      for each register of the predetermined number of registers having its CRC check remainder byte affected by one of the error patterns in the sector, an adder for adding a corresponding affecting one of the error patterns to the register;
      a circuit for determining whether the contents of any of the registers indicates inaccurate correction of the errors.

2. An error correction system for rotating magnetic media, the error correction system comprising:
   a CRC generator/checker which generates CRC check remainder bytes by (1) using input data from a read sector to obtain regenerated CRC bytes for the read sector and (2) adding the regenerated CRC bytes to incoming CRC bytes of the read sector;
   a correction unit which generates error patterns for correcting errors in the read sector;
   a correction checker unit, responsive to the CRC check remainder bytes and the error patterns, for confirming that the error patterns accurately correct the errors in the read sector, wherein the correction checker unit comprises a first stage, and wherein the first stage includes:
      a register having a register input terminal and a register output terminal;
      a register input gate connected to control input to the register input terminal;
      a timing control gate which receives signals at least derived from the error patterns;
      an adder, the adder having a first input terminal connected to an output terminal of the timing control gate and a second input terminal connected to the register output terminal, an adder output terminal of the adder being connected to a first input terminal of the register input gate;
      a second input terminal of the register input gate being connected to receive the CRC check remainder bytes;
      a feedback multiplier connected between the register output terminal and a third input terminal of the register input gate.

3. The system of claim 2, wherein the correction checker unit comprises a plurality of stages including the first stage and at least one further stage, the further stage differing from the first stage by having the second input terminal of the register input gate connected to the register output terminal of a preceding one of the plurality of stages.

4. The system of claim 2, wherein the correction checker unit has six stages.

5. The system of claim 2, wherein the correction checker unit has a number of stages corresponding to a programmable number of CRC bytes per sector.

6. The system of claim 2, wherein the correction checker unit comprises a segmentation compensation circuit which outputs a compensated error pattern, and wherein the timing control gate receives the compensated error patterns.

7. The system of claim 2, wherein the timing control gate has a first input terminal which receives the error patterns and a second input terminal which turns on the timing control gate only when the error patterns being applied to the timing control gate affect a CRC byte loaded into the register.

8. The system of claim 2, wherein each stage of the correction checker unit includes a register content checking gate connected to the output terminal of the register of the stage.

9. The system of claim 8, wherein the correction checker unit further comprises an all-byte zero checking gate to which the register content checking gates of all stages are connected, and which produces a predetermined signal when the correction checker unit is unable to verify correction by the correction unit.

10. An error correction method for rotating magnetic media, the error correction method comprising:
    generating CRC check remainder bytes by:

a) using input data from a read sector to obtain regenerated CRC bytes for the read sector, and (b) adding the regenerated CRC bytes to incoming CRC bytes of the read sector;

generating error patterns for correcting errors in the read sector;

using the CRC check remainder bytes and the error patterns for confirming that the error patterns accurately correct the errors in the read sector by:

(1) loading a predetermined number of the CRC check remainder bytes into a corresponding number of registers;

(2) for each of a plurality of error patterns of the sector, adding the error pattern to the register having its CRC check remainder byte affected by the error pattern;

(3) determining whether the contents of any of the registers indicates inaccurate correction of the errors.

11. The method of claim 10, wherein error patterns for ECC bytes in the sector are not included in step (2).

12. The method of claim 10, wherein a segmentation compensated error pattern is added to the register when the error pattern is for data in the sector.

13. The method of claim 10, wherein step (1) comprises shifting the predetermined number of the CRC check remainder bytes through a plurality of registers connected to function as a shift register.

14. The method of claim 10, wherein step (3) comprises a logical operation upon the contents of each of the registers.

15. The method of claim 10, wherein step (2) is executed during a clocking of bytes of the sector, and wherein during a clocking of data of the sector the registers are clocked with feedback multiplication at predetermined clocking intervals.

16. The method of claim 15, wherein the sector is clocked to process ECC bytes first, followed by CRC bytes, followed by data bytes.

* * * * *